(12) United States Patent
Tobioka

(10) Patent No.: US 10,274,841 B2
(45) Date of Patent: Apr. 30, 2019

(54) RETICLE WITH REDUCED TRANSMISSION REGIONS FOR DETECTING A DEFOCUS CONDITION IN A LITHOGRAPHY PROCESS

(71) Applicant: SanDisk Technologies LLC, Plano, TX (US)

(72) Inventor: Akihiro Tobioka, Yokkaichi (JP)

(73) Assignee: SanDisck Technologies LLC, Addison, TX (US)

( * ) Notice: Subject to any disclaimer, the term of this patent is extended or adjusted under 35 U.S.C. 154(b) by 49 days.

(21) Appl. No.: 15/724,488

(22) Filed: Oct. 4, 2017

(65) Prior Publication Data
US 2018/0024375 A1    Jan. 25, 2018

Related U.S. Application Data

(62) Division of application No. 14/882,258, filed on Oct. 13, 2015, now Pat. No. 9,810,916.

(60) Provisional application No. 62/182,396, filed on Jun. 19, 2015.

(51) Int. Cl.
    G03F 7/20      (2006.01)
    G02B 5/02      (2006.01)
    G03F 1/44      (2012.01)
    G02B 27/32     (2006.01)

(52) U.S. Cl.
    CPC ....... *G03F 7/70641* (2013.01); *G02B 5/0278* (2013.01); *G02B 27/32* (2013.01); *G03F 1/44* (2013.01)

(58) Field of Classification Search
    CPC .................................................. G03F 7/70641
    USPC ................................................. 430/5, 22, 30
    See application file for complete search history.

(56) References Cited

U.S. PATENT DOCUMENTS

| | | | |
|---|---|---|---|
| 4,764,432 | A | 8/1988 | Kalbitzer |
| 5,718,991 | A | 2/1998 | Lin et al. |
| 6,783,903 | B2 | 8/2004 | Choi |
| 6,885,429 | B2 | 4/2005 | Lyons et al. |
| 7,035,446 | B2 | 4/2006 | Medvedeva et al. |
| 7,352,452 | B2 | 4/2008 | Wegmann et al. |
| 7,442,951 | B2 | 10/2008 | Smith |
| 2003/0095243 | A1 | 5/2003 | Yu et al. |
| 2015/0037714 | A1 | 2/2015 | Cai |
| 2016/0370598 | A1 | 12/2016 | Tobioka |

FOREIGN PATENT DOCUMENTS

WO    WO2012/103933 A1    8/2012

OTHER PUBLICATIONS

Pease, R. Fabian, et al., "Lithography and Other Patterning Techniques for Future Electronics," Proceedings of the IEEE, vol. 96, No. 2, Feb. 2008, 23 pages.
Goonesekera, Arosha, et al., "A Study of Closed Loop Application: WLCD-CDC for 32 nm and beyond reticles," Proc. of SPIE, vol. 8166, Nov. 2011, 10 pages.
Hunsche, Stefan, et al., "A new paradigm for in-line detection and control of patterning defects," Proc. of SPIE, vol. 9424, Mar. 2015, 12 pages.
Imai, Hidemichi, et al., "A study of closed-loop application for logic patterning," Proc. of SPIE, vol. 8441, Jul. 2012, 9 pages.
Restriction Requirement dated Apr. 19, 2017, U.S. Appl. No. 14/882,258, filed Oct. 13, 2015.
Response to Restriction Requirement dated May 22, 2017, U.S. Appl. No. 14/882,258, filed Oct. 13, 2015.
Non-final Office Action dated Jun. 7, 2017, U.S. Appl. No. 14/882,258, filed Oct. 13, 2015.
Response to Office Action dated Jul. 6, 2017, U.S. Appl. No. 14/882,258, filed Oct. 13, 2015.
Notice of Allowance dated Aug. 18, 2017, U.S. Appl. No. 14/882,258, filed Oct. 13, 2015.

*Primary Examiner* — Christopher G Young
(74) *Attorney, Agent, or Firm* — Vierra Magen Marcus LLP

(57) ABSTRACT

A reticle for a semiconductor lithography process includes a glass plate having regions with a reduced optical transmission factor. The regions may include arrays of elements comprising defects such as cracks or voids which are formed by laser pulses. The regions may be adjacent to openings in an opaque material at the bottom of the reticle to shield the openings from a portion of the light which illuminates the reticle from the top. As a result, the light which exits the reticle and is used to pattern a substrate has an asymmetric intensity. This allows the substrate to be patterned with an inspection mark which indicates whether a defocus condition exists, and whether there is a positive or negative defocus condition. Related methods use a reticle to form a pattern on a substrate and for adjusting a focus condition using a reticle.

9 Claims, 20 Drawing Sheets

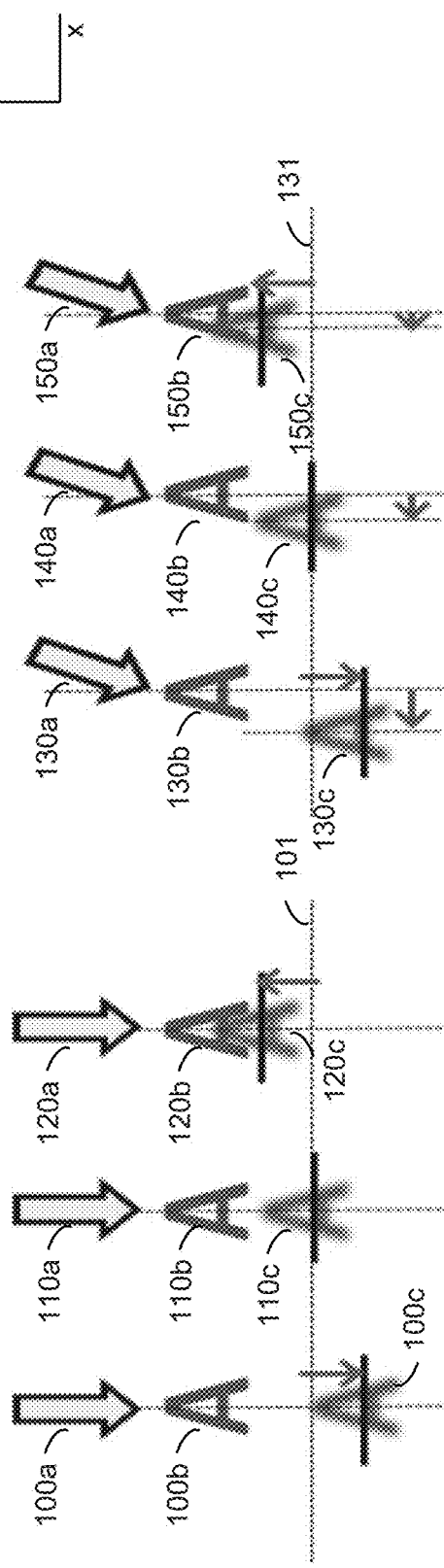

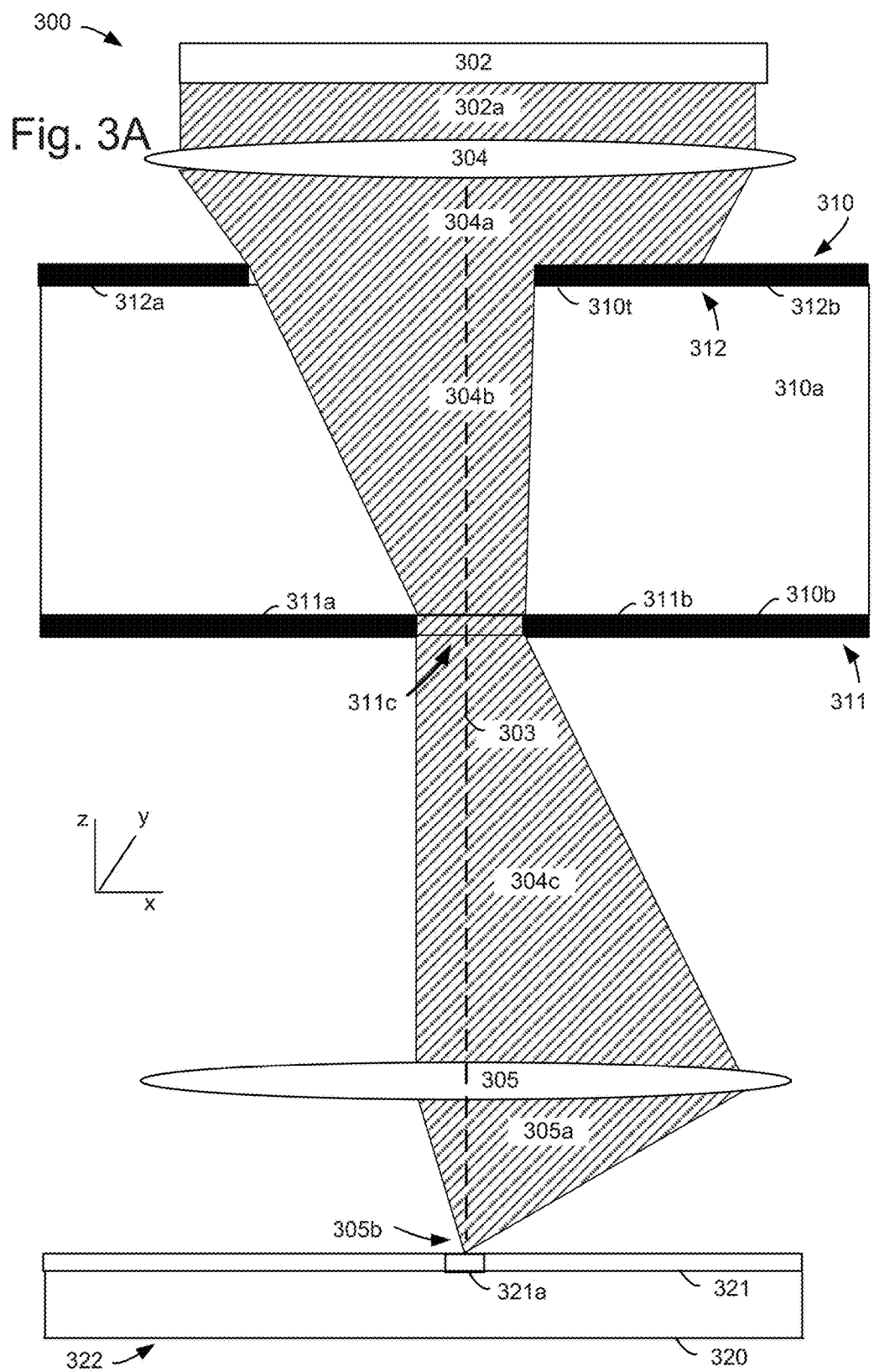

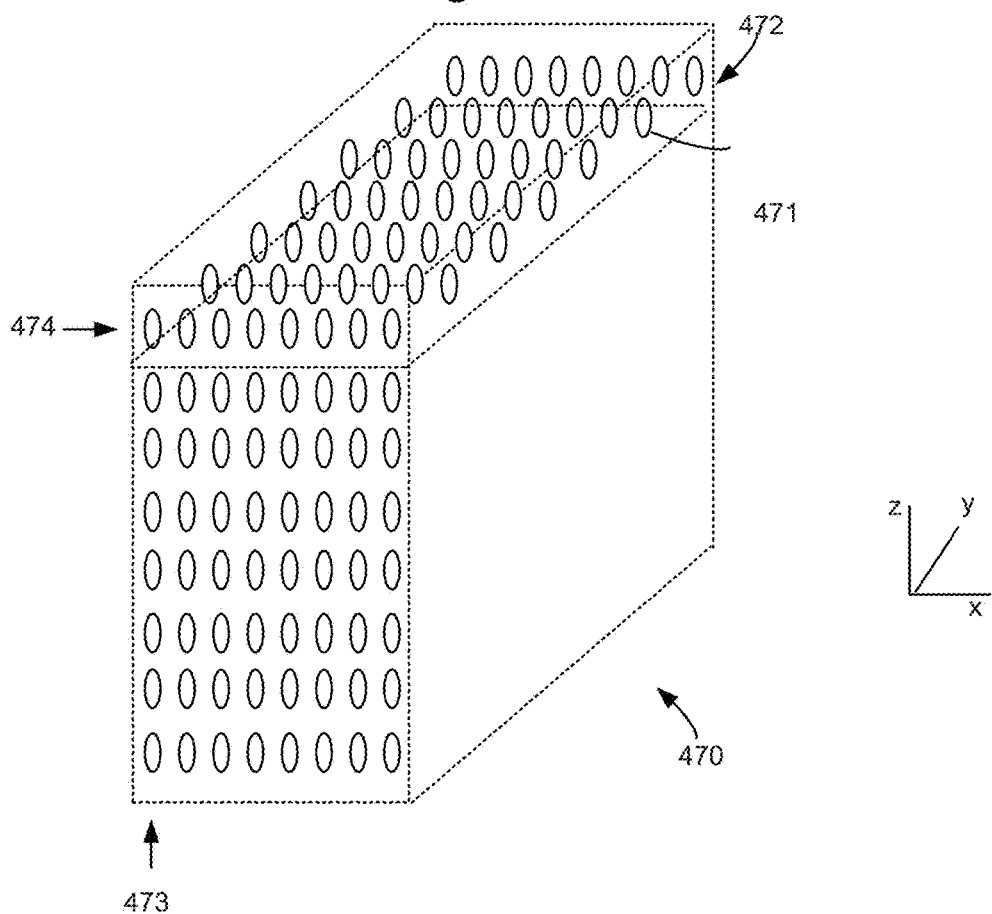
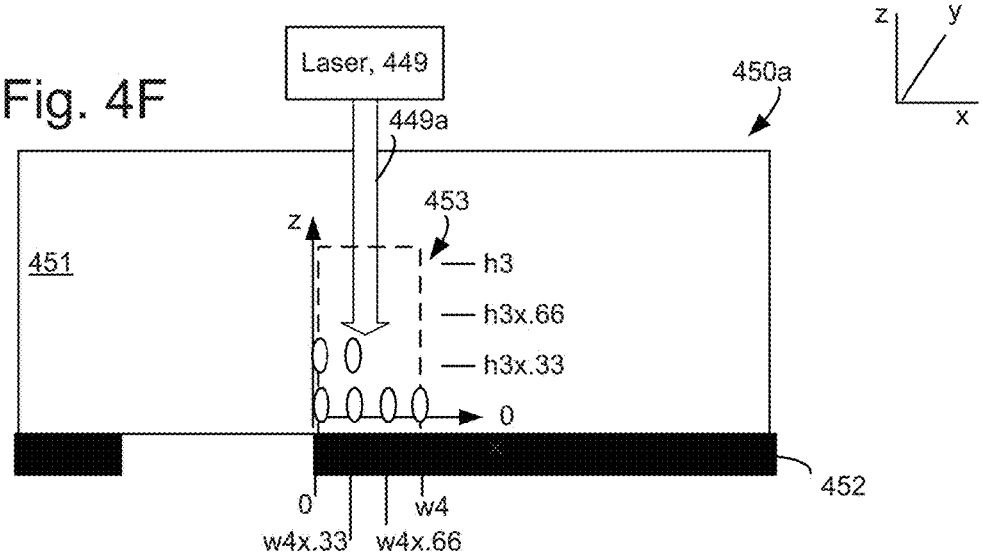

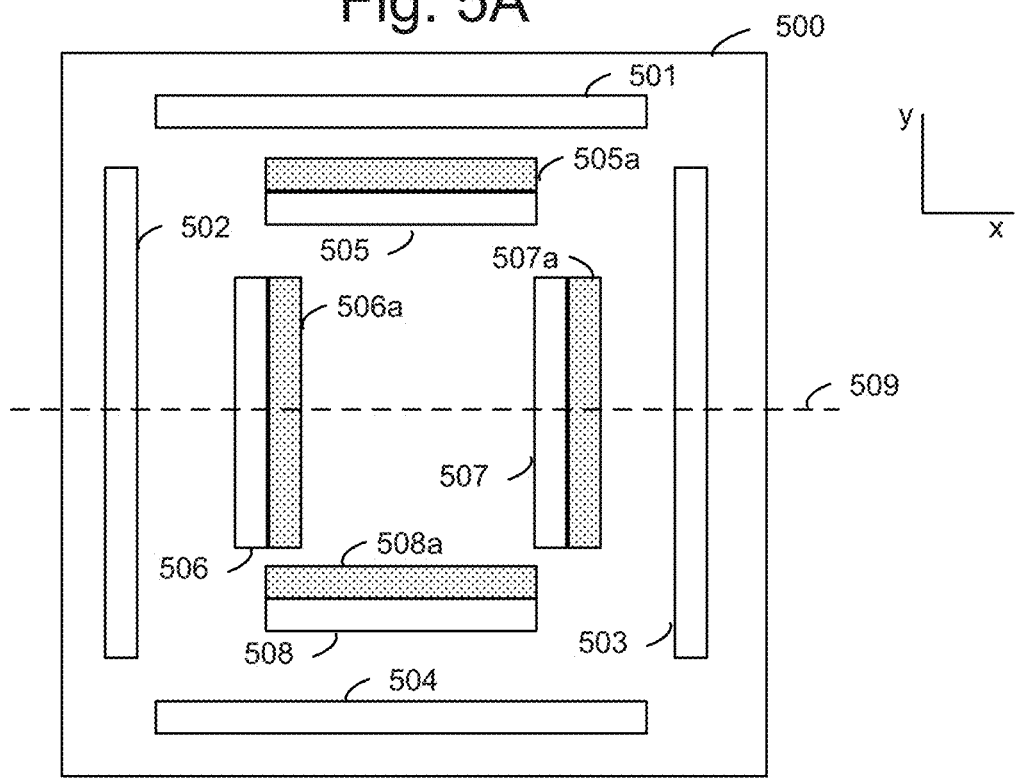
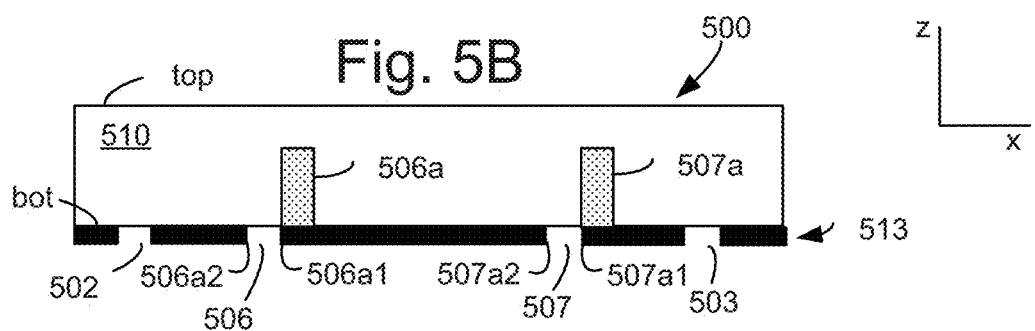

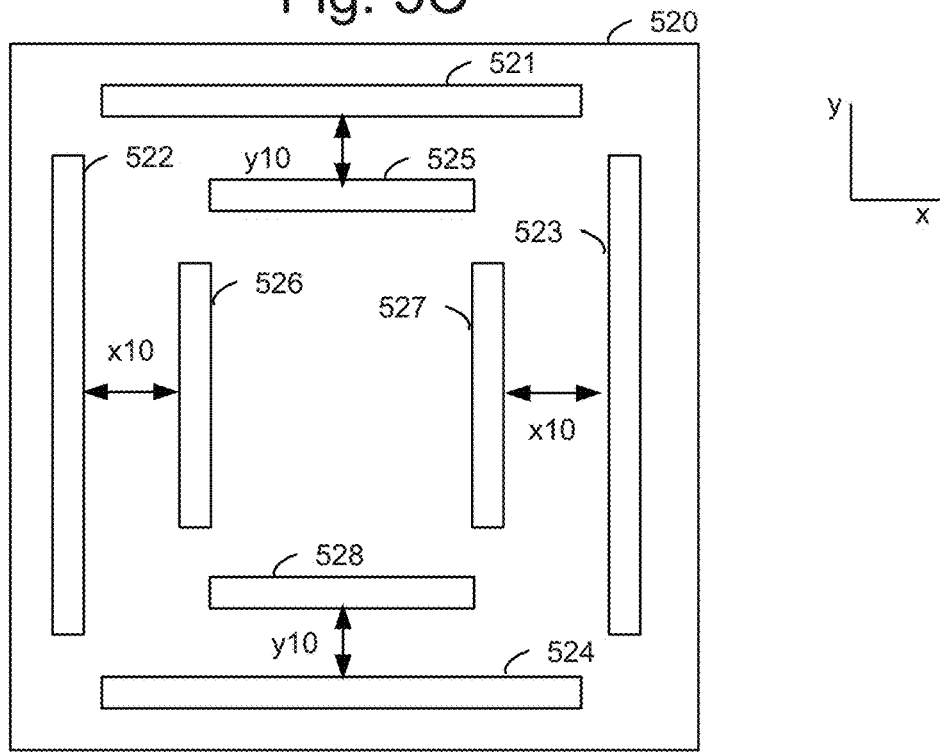
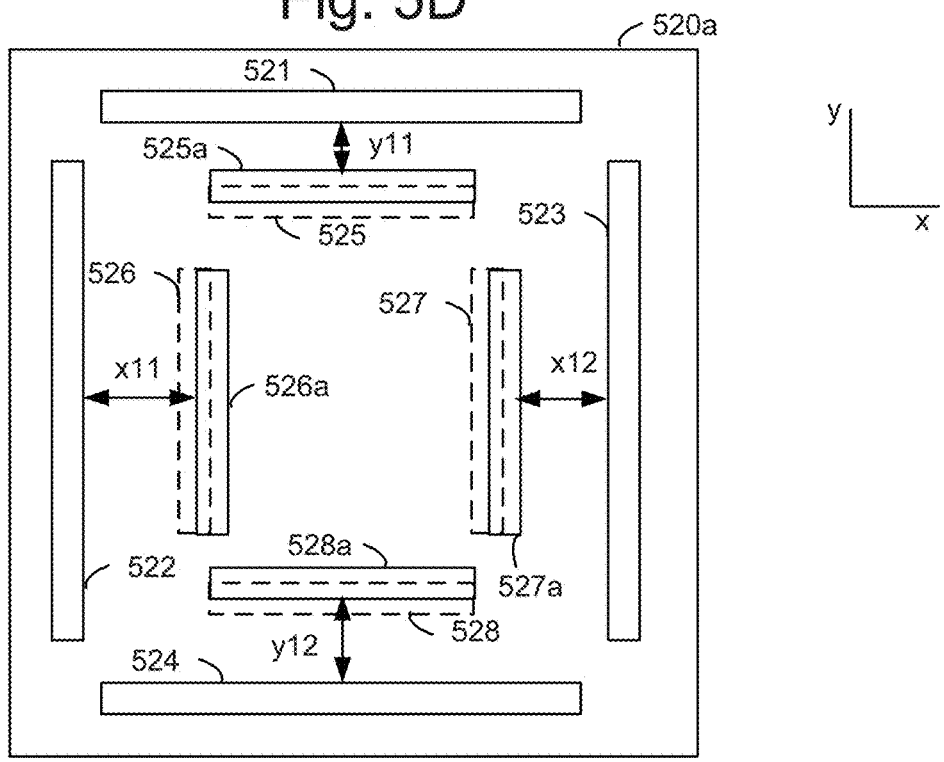

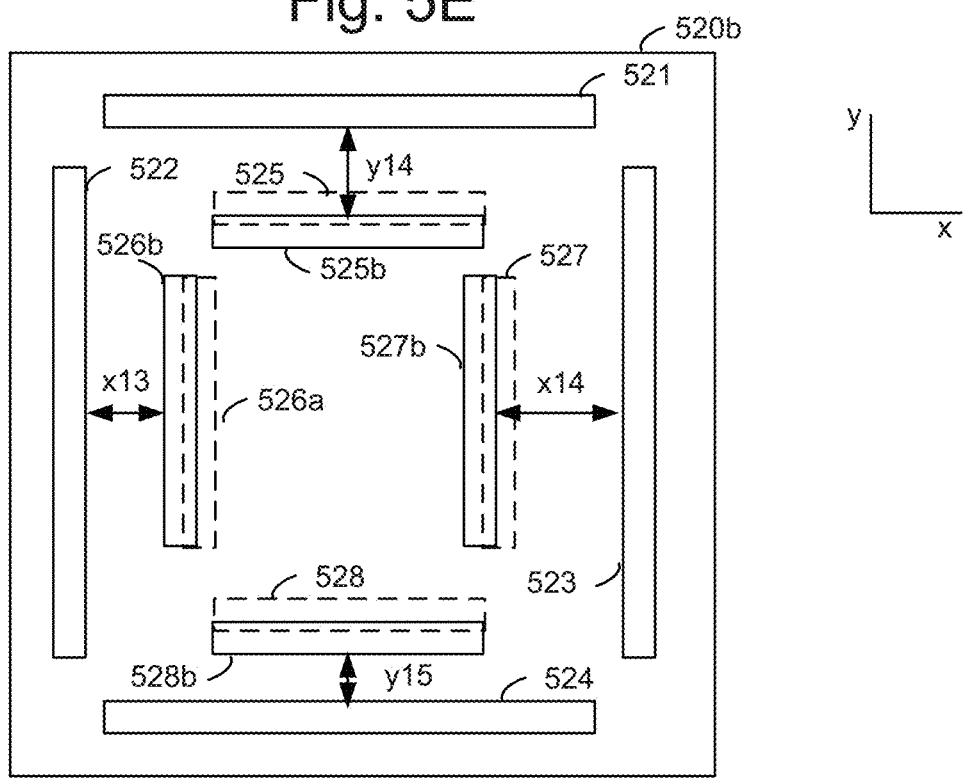

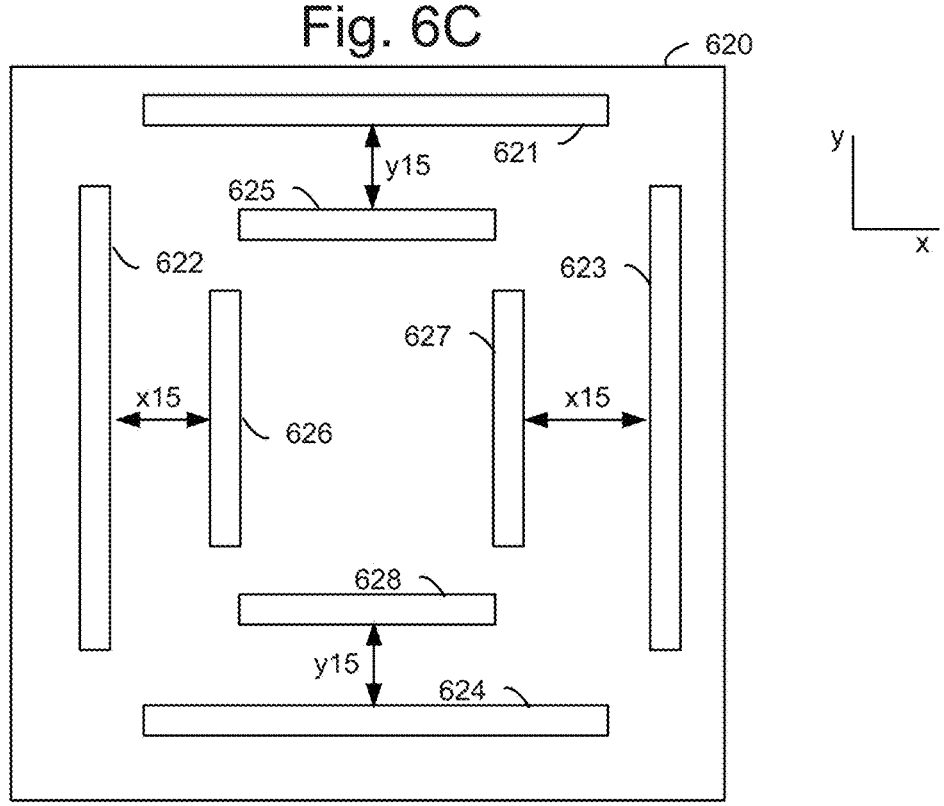
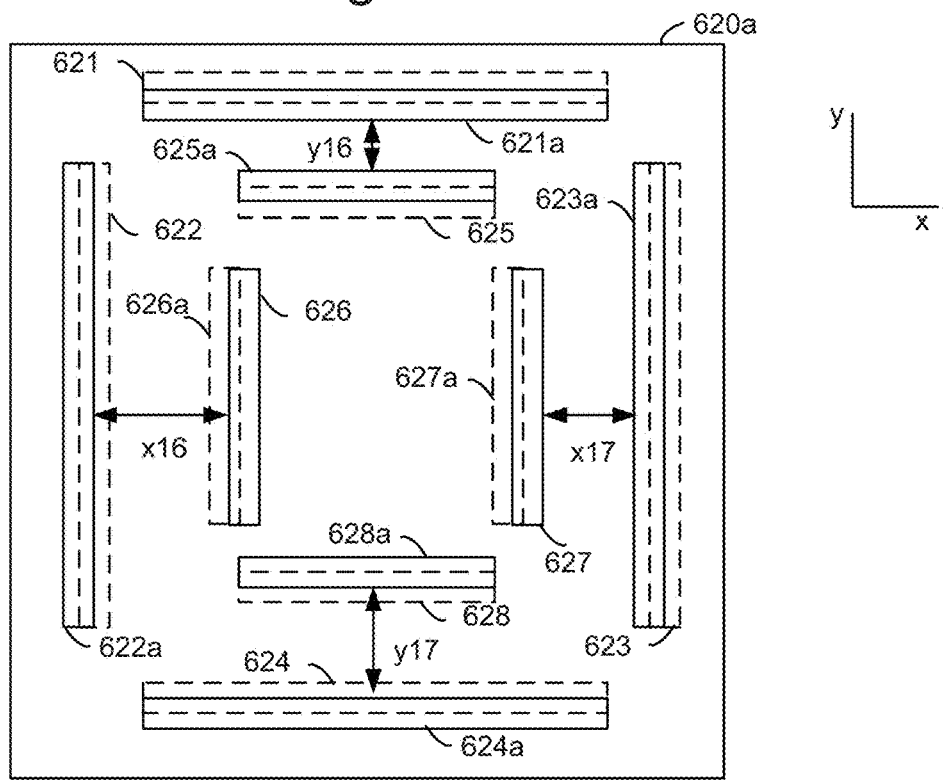

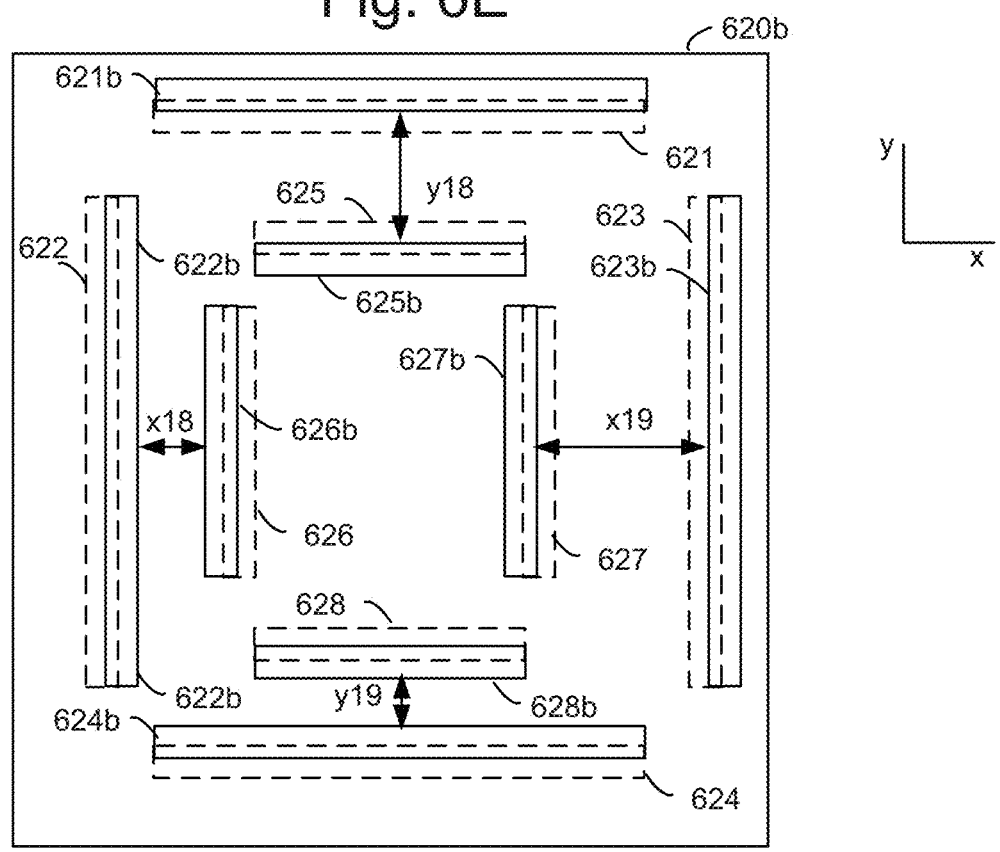

RETICLE WITH REDUCED TRANSMISSION REGIONS FOR DETECTING A DEFOCUS CONDITION IN A LITHOGRAPHY PROCESS

CLAIM OF PRIORITY

This application is a divisional application of U.S. patent application Ser. No. 14/882,258, entitled "Reticle With Reduced Transmission Regions For Detecting A Defocus Condition In A Lithography Process," by Akihiro Tobioka, filed Oct. 13, 2015, and published as US 2016/0370598 on Dec. 22, 2016 and issued as U.S. Pat. No. 9,810,916 on Nov. 7, 2017, which claims the benefit of U.S. Provisional Patent Application No. 62/182,396, entitled "Focus Monitor Method In Lithography Process," by Akihiro Tobioka, filed Jun. 19, 2015, both of which are incorporated herein by reference in their entirety.

BACKGROUND

The present technology relates to a reticle and to a semiconductor lithography process.

Lithography processes allow for the accurate fabrication of semiconductor devices. Typically, light is passed through a reticle to form a pattern on a substrate. The pattern corresponds to a pattern which is formed in an opaque material on an underside of the reticle. In one approach, the light exposes a portion of a photoresist layer on the substrate according to the pattern. In the case of a positive photoresist, the portion of the photoresist that is exposed to light becomes soluble to, and is removed by, a photoresist developer while the remaining portion of the photoresist remains insoluble to the photoresist developer. The remaining portion of the photoresist can then be used as a mask to etch an underlying layer on the substrate. The remaining photoresist is subsequently removed to allow additional patterning. Or, a negative photoresist could be used in which the portion of the photoresist that is exposed to light becomes insoluble.

BRIEF DESCRIPTION OF THE DRAWINGS

Like-numbered elements refer to common components in the different figures.

FIG. 1A shows an example of a telecentric optical system.

FIG. 1B shows an example of an error in a telecentric optical system.

FIG. 3A depicts a comparative lithography apparatus for patterning a substrate using an asymmetric light pattern, where a best focus condition exists, and where a reticle with top and bottom opaque materials is used.

FIG. 4E depicts a perspective view of a reduced transmission region of a reticle, showing a plurality of elements such as voids or cracks arranged in arrays of elements.

FIG. 4F depicts the formation of elements in the reticle 450 of FIG. 4C.

FIG. 5A depicts a top view of an example reticle comprising reduced transmission regions adjacent to respective slits, where the reduced transmission regions are on a same side of the respective slits.

FIG. 5B depicts a cross-sectional view of the reticle of FIG. 5A along line 509.

FIG. 5C depicts a pattern on a substrate formed using the reticle of FIG. 5A, where a best focus condition exists.

FIG. 5D depicts a pattern on a substrate formed using the reticle of FIG. 5A, where a minus focus condition exists.

FIG. 5E depicts a pattern on a substrate formed using the reticle of FIG. 5A, where a plus focus condition exists.

FIG. 6C depicts a pattern on a substrate formed using the reticle of FIG. 6A where a best focus condition exists.

FIG. 6D depicts a pattern on a substrate formed using the reticle of FIG. 6A where a minus focus condition exists.

FIG. 6E depicts a pattern on a substrate formed using the reticle of FIG. 6A where a plus focus condition exists.

DETAILED DESCRIPTION

Figure 2A:
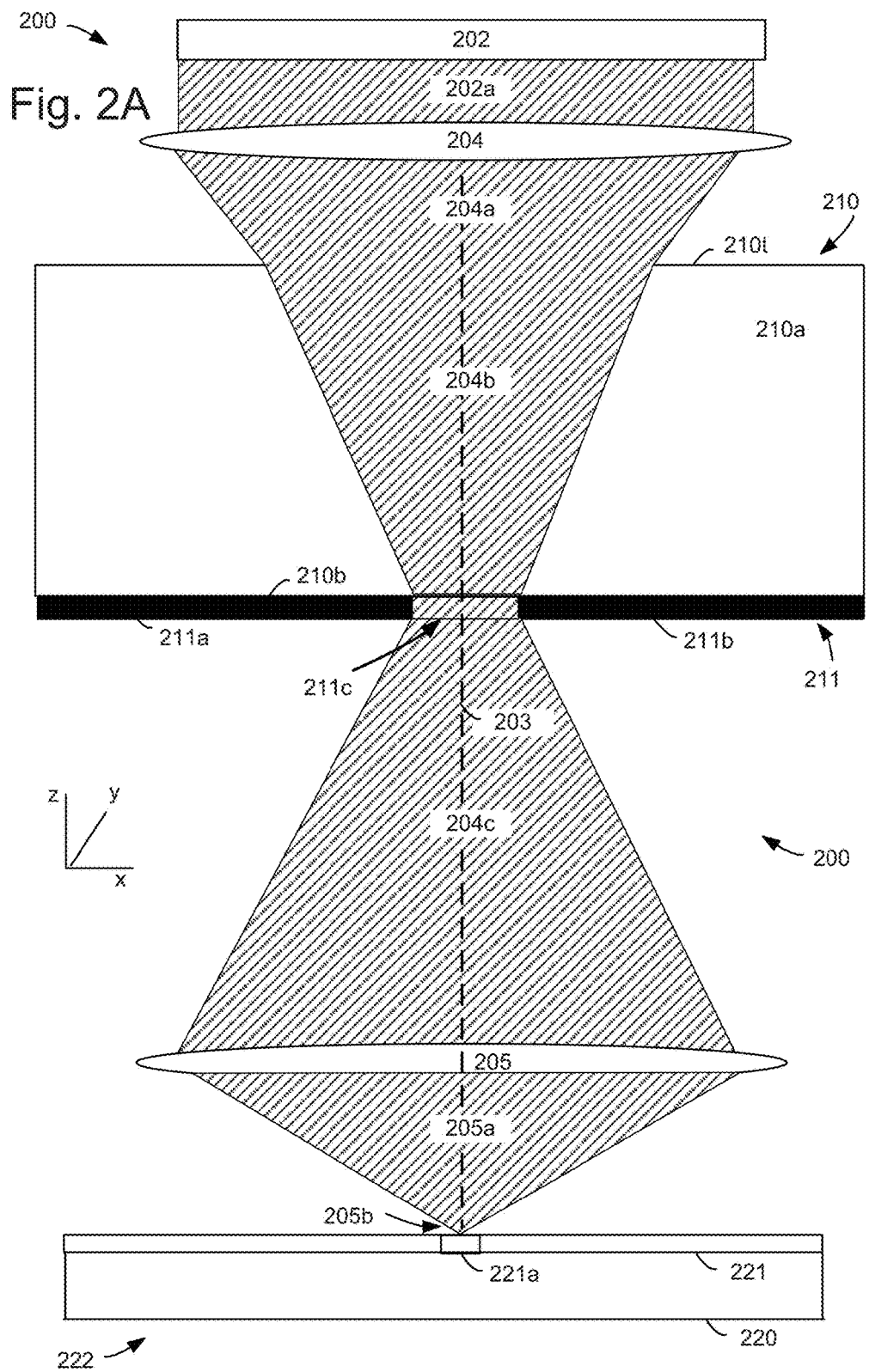
FIG. 2A depicts a lithography apparatus 200 for patterning a substrate using a symmetric light pattern, where a best focus condition exists.

The present technology provides a reticle and an associated focus monitoring method which can measure a precise focus position for a lithography process for advanced scaled devices including memory devices.

A reticle is used for patterning a semiconductor substrate in a semiconductor lithography apparatus. When light from a light source is passed through the reticle, the focal point or plane of the light should be carefully controlled to obtain the best pattern. In particular, the light should be focused at the surface of the substrate. However, various factors can lead to a defocus, or out of focus, condition, which degrades the quality of the pattern, making it less sharp. The width of the pattern may also be widened relative to a width of the best focus condition. The defocus condition has a serious impact on production yield in a lithography process due to a pattern error on the wafer, such as critical dimension error, pattern short and pattern collapse. Accordingly, it is useful to measure the defocus position and provide it as a feedback to a lithography process.

In particular, it is useful to pattern the substrate using light with an asymmetric intensity where the asymmetry is evidenced by the pattern. However, reticles which provide such asymmetry have been costly. A reticle provided herein addresses the above and other issues. In an example embodiment, the reticle includes region with a reduced optical transmission factor which causes the asymmetry. The region can be formed with laser pulses in specific locations of the reticle. In this approach, there is no need to pattern both top and bottom surfaces of the reticle. Related methods are also provided.

FIG. 1A shows an example of a telecentric optical system. In a telecentric optical system, every pattern location has an independent focus condition. The shifts in the pattern are independent for different focus errors. Thus, if a telecentric error occurs only at a focus inspection mark, we can detect the pattern lateral shift as a focus error.

Light is passed through reticles to form a pattern on a substrate. In a best focus condition, light which is represented by an arrow 110a is passed through a reticle 110b to form a pattern 110c. The pattern, an "A" shape, is focused at a surface 101 of a substrate. In a minus or negative focus condition, light which is represented by an arrow 100a is passed through a reticle 100b to form a pattern 100c. The pattern is focused at a height which is below the surface of the substrate. In a plus or positive focus condition, light which is represented by an arrow 120a is passed through a reticle 120b to form a pattern 120c. The pattern is focused at a height which is above the surface of the substrate. In these examples, the light travels perpendicular to the substrate. The minus focus condition may represent the focal point or plane of the incident light being below the substrate surface, while the plus focus condition may represent the focal point or plane of the incident light being above the substrate surface.

More specifically, in a positive defocus condition, the focal point of the light is above a plane of best focus which will expose the photoresist. In a nominal focus condition, the focal point is directly on the plane of best focus, where a contrast between the illuminated photoresist and the non-illuminated photoresist is at its maximum. In a negative defocus condition, the focal point of the light is below the plane of best focus. The plane of best focus can be at the top, bottom or some intermediate point of the photoresist layer.

FIG. 1B shows an example of an error in a telecentric optical system. In these examples, the light travels at a non-perpendicular angle to the substrate. In a best focus condition, light which is represented by an arrow 140a is passed through a reticle 140b to form a pattern 140c. The pattern is focused at a surface 131 of a substrate. However, the focus is shifted to the left of where it should be by a moderate amount. In a plus focus condition, light which is represented by an arrow 130a is passed through a reticle 130b to form a pattern 130c. The pattern is focused below the surface of the substrate. The focus is shifted to the left of where it should be by a relatively high amount, compared to the best focus and the minus focus conditions. In a minus focus condition, light which is represented by an arrow 150a is passed through a reticle 150b to form a pattern 150c. The pattern is focused above the surface of the substrate. The focus is also shifted to the left of where it should be by a relatively small amount, compared to the best focus and the plus focus conditions.

The accuracy of the lithography process depends on the focus condition. The pattern width may change in each of the defocus cases. In the example apparatus of FIG. 2A-2F, a defocus condition can be detected, but we cannot detect whether a plus or minus defocus condition has occurred. That is, the direction of the defocus cannot be detected. This occurs because a width of the pattern can be the same for the plus or minus defocus condition. In addition, this is a telecentric optical system so that every pattern location has an independent focus condition. In this case, we cannot detect the focus position by using critical dimension (CD) measurement and overlay measurement.

FIG. 2A depicts a lithography apparatus 200 for patterning a substrate using a symmetric light pattern, where a best focus condition exists. The best focus condition is, e.g., an optimal focus condition. The apparatus includes a light source 202 which produces light 202a. One example is a laser, such as an argon fluoride (ArF) laser which provides light with a 193 nanometer wavelength, in the deep ultraviolet range. The light 202a passes through an illumination lens 204 to provide light 204a. This light passes through a reticle 210. In one approach, the reticle comprises a glass plate such as fused quartz or fused silica. The glass plate may have a predetermined thickness and comprise planar, parallel, spaced apart top and bottom surfaces, in one approach. The glass plate includes a top surface 210t, a bottom surface 210b and a bulk or body region 210a. An opaque material 211 such as chrome is formed on the bottom surface of the glass plate. The opaque material, including portions 211a and 211b, is patterned with openings, such as opening 211c, in a desired pattern which is to be reproduced on a substrate. For example, the pattern may comprises slits which extend along the bottom of the glass plate. The light 204b in the glass plate is generally symmetric relative to a vertical or central axis 203. This axis may be in z direction which is perpendicular to an x-y plane which is a plane in which the glass plate extends. The x-y-z Cartesian coordinate system depicted is used consistently through the figures.

Light 204c exits the glass plate through the openings and reaches a projection lens 205. This light is also generally symmetric relative to the central axis. Light 205a which is output from the lens is focused at the top surface of a wafer 222 at a focal point or plane 205b. The wafer includes a substrate 220 and a photoresist layer 221 on the substrate. A portion 221a of the photoresist is exposed by the light 205a, according to the focal point 205b. This example assumes a positive photoresist is used.

The apparatus is depicted using a simplified example. In practice, additional lenses may be used.

Figure 2B:
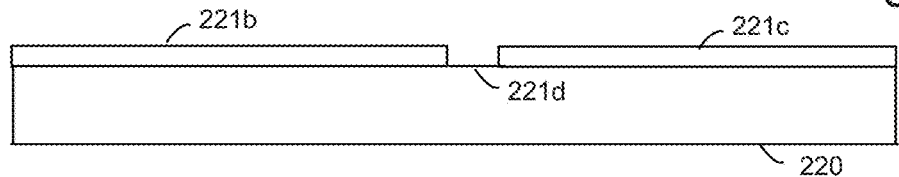
FIG. 2B depicts a cross-sectional view of a patterned photoresist layer on the substrate 220 of FIG. 2A which is obtained with the best focus condition of FIG. 2A.

FIG. 2B depicts a cross-sectional view of a patterned photoresist layer on the substrate 220 of FIG. 2A which is obtained with the best focus condition of FIG. 2A. After the photoresist is exposed, the exposed portion is dissolved by a photoresist developer, forming an opening between remaining portions 221b and 221c of the photoresist layer. This is an example of a single opening but many openings may be formed according to the pattern. A subset of the pattern may be used for inspection marks. The opening, e.g., slit, may have a fixed width in the x direction and be elongated along the y axis, for instance.

Figure 2C:
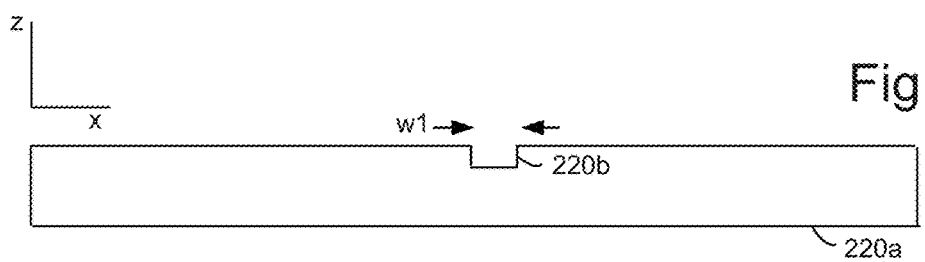
FIG. 2C depicts a cross-sectional view of a patterned substrate which is formed from the patterned photoresist layer of FIG. 2B.

FIG. 2C depicts a cross-sectional view of a patterned substrate 220a which is formed from the patterned photoresist layer of FIG. 2B. The photoresist layer can be used as a mask for patterning the substrate 220, such as by using an etching process. An opening 220b having a width w1 is formed in the substrate under the opening 221d. The opening 220b may comprises a trench, for example, which extends in the y direction. Subsequent processing steps can include filling in the trench with a conductive material, for instance. Many other lithography processes can be performed as well.

In forming the pattern on the wafer, in one approach, laser light is passed through the reticle while the reticle is moved in a stepping process. The laser travels along the length of an opening in the opaque material of the reticle.

Figure 2D:
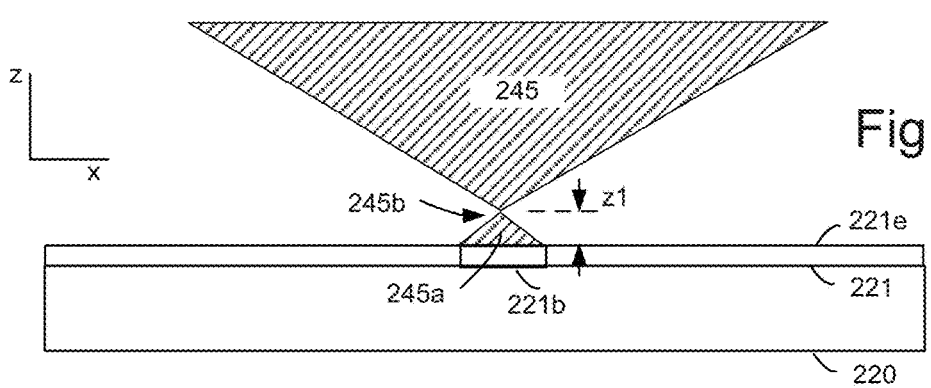
FIG. 2D depicts a portion of the lithography apparatus of FIG. 2A, where a plus focus condition exists.

FIG. 2D depicts a portion of the lithography apparatus of FIG. 2A, where a plus focus condition exists. In this case, light 245 from the projection lens has a focal point 245b which is above the top 221e of the photoresist layer by a distance z1. A portion 245a of the light is incident on a region 221b of the photoresist layer. In these examples, assume the best plane of focus is at the top 221e of the photoresist layer, as an example.

Figure 2E:
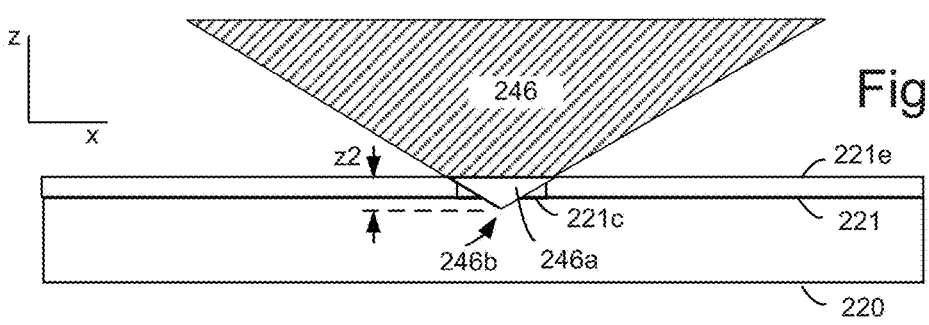
FIG. 2E depicts a portion of the lithography apparatus of FIG. 2A, where a minus focus condition exists.

FIG. 2E depicts a portion of the lithography apparatus of FIG. 2A, where a minus focus condition exists. In this case, light 246 from the projection lens has a focal point 246b which is below the top 221e of the photoresist layer by a distance z2. A portion 246a of the light is incident on a portion 221c of the photoresist layer.

Figure 2F:
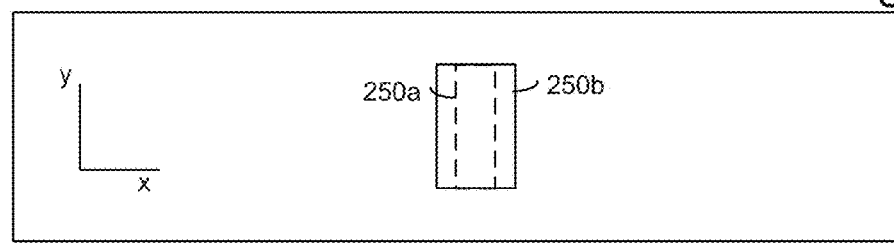
FIG. 2F depicts a top view of a patterned substrate which is formed using the best focus condition of FIG. 2A (pattern 250a), or the plus focus condition of FIG. 2D or the minus focus condition of FIG. 2E (pattern 250b).

FIG. 2F depicts a top view of a patterned substrate 250 which is formed using the best focus condition of FIG. 2A (pattern 250a), or the plus focus condition of FIG. 2D or the minus focus condition of FIG. 2E (pattern 250b). The same widened pattern 250b is observed with either the plus or minus defocus condition. For example, the substrate can be viewed using a scanning electron microscope or other optical measurement tool. As a result, it can be concluded that a defocus condition exists, but not whether it is a plus or minus defocus condition. This makes it difficult to adjust the apparatus to correct the defocus condition.

FIG. 3A depicts a comparative lithography apparatus for patterning a substrate using an asymmetric light pattern, where a best focus condition exists, and where a reticle with top and bottom opaque materials is used. This approach provides opaque materials on both the top and bottom of the glass plate of the reticle. The pattern in the top opaque material results in asymmetric light entering the glass plate and the projection lens and reaching the substrate. While this allows distinguishing between a plus or minus defocus condition, it is necessary to pattern the top opaque material in addition to the bottom opaque material, so that the cost is high.

The opaque material 312 on the top include portions 312a and 312b with an opening between them to allow light in. The pattern on the backside or top of the reticle is asymmetric to the pattern on the bottom of the reticle, which is to be transferred to the substrate. As a result, diffraction beams of the laser which pass through the reticle are also asymmetric. This causes patterns on the wafer to shift in a lateral direction depending on the defocusing direction. One can measure this shift by using a scanning electron microscope or optical measurement tools and converting the measurement to a defocus position. When a defocus condition is detected in a lithography process, the lithography tool is stopped and the focus condition is re-setup.

The apparatus 300 includes a light source 302 such as a laser which produces light 302a. The light 302a passes through an illumination lens 304 to provide light 304a. This light passes through a reticle 310. In one approach, the reticle comprises a glass plate which includes a top surface 310t, a bottom surface 310b and a bulk or body region 310a. An opaque material 311 such as chrome is formed on the bottom surface of the glass plate. The opaque material, including portions 311a and 311b, is patterned with openings, such as opening 311c, in a desired pattern which is to be reproduced on a substrate. The light 304b in the glass plate is generally asymmetric in its intensity relative to a vertical or central axis 303.

Light 304c exits the glass plate through the openings and reaches a projection lens 305. This light is also generally asymmetric relative to the central axis. The asymmetry may refer to an intensity profile across the light beam at a given height above the substrate or z coordinate. Light 305a which is output from the lens is focused at the top surface of a wafer 322 at a focal point or plane 305b. The wafer 322 includes a substrate 320 and a photoresist layer 321 on the substrate. A portion 321a of the photoresist is exposed by the light 305a, according to the focal point 305b.

Figure 3B:
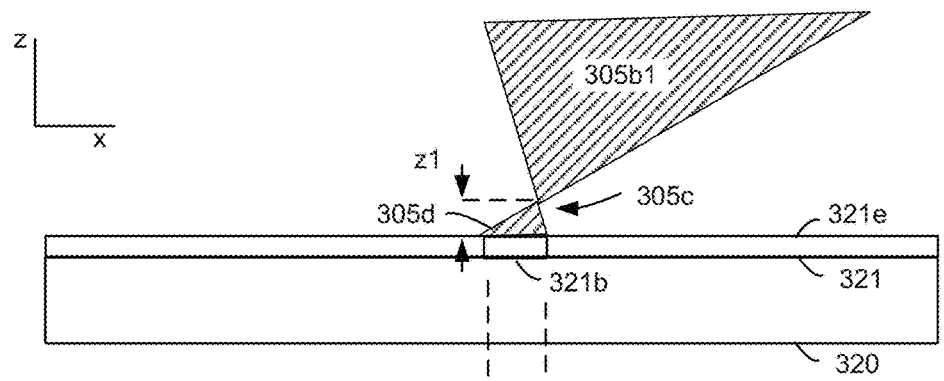
FIG. 3B depicts a portion of the lithography apparatus of FIG. 3A, where a plus focus condition exists.

FIG. 3B depicts a portion of the lithography apparatus of FIG. 3A, where a plus focus condition exists. In this case, light 305b1 from the projection lens has a focal point 305c which is above the top 321e of the photoresist layer by a distance z1. A portion 305d of the light is incident on a region 321b of the photoresist layer.

Figure 3C:
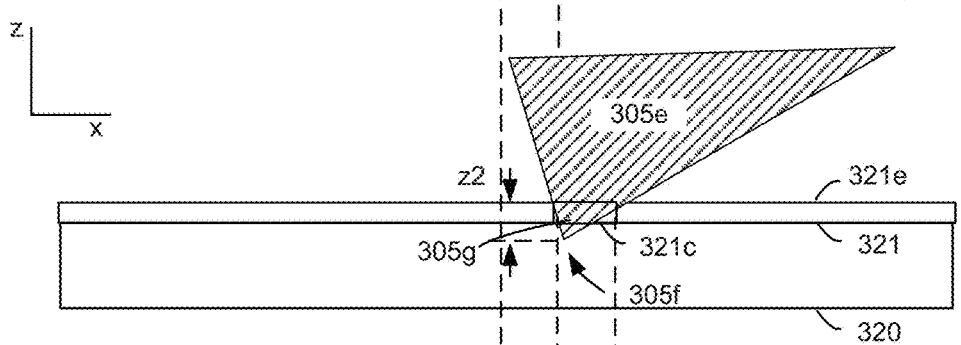
FIG. 3C depicts a portion of the lithography apparatus of FIG. 3A, where a minus focus condition exists.

FIG. 3C depicts a portion of the lithography apparatus of FIG. 3A, where a minus focus condition exists. In this case, light 305e from the projection lens has a focal point 305f which is below the top 321e of the photoresist layer by a distance z2. A portion 305g of the light is incident on a region 321c of the photoresist layer.

Figure 3D:
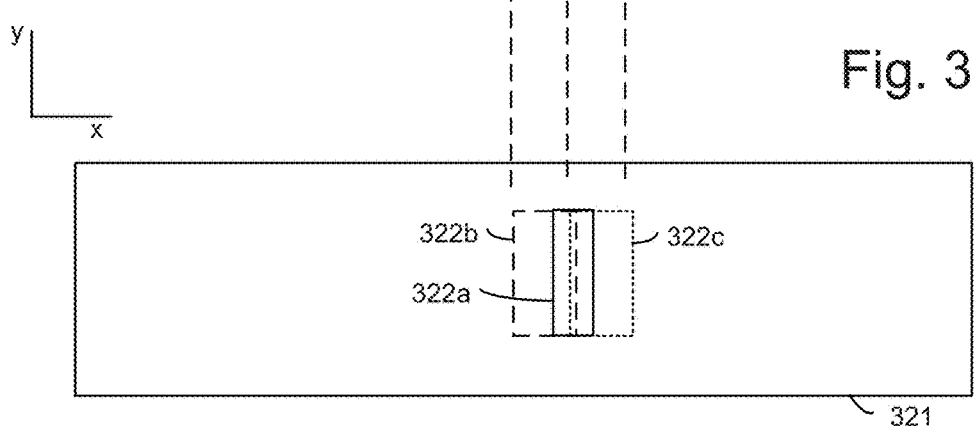
FIG. 3D depicts a top view of a patterned substrate which is formed using the best focus condition of FIG. 3A (pattern 322a), the plus focus condition of FIG. 3B (pattern 322b) or the minus focus condition of FIG. 3C (pattern 322c).

FIG. 3D depicts a top view of a patterned substrate which is formed using the best focus condition of FIG. 3A (pattern 322a), the plus focus condition of FIG. 3B (pattern 322b) or the minus focus condition of FIG. 3C (pattern 322c). The vertical dashed lines show an alignment of FIGS. 3B, 3C and 3D. The pattern with the plus focus condition is shifted to the left, e.g., along the −x axis, of the pattern with the best focus condition. Similarly, the pattern with the minus focus condition is shifted to the right, e.g., along the +x axis, of the pattern with the best focus condition. Accordingly, as mentioned, by examining the position of the pattern relative to a known reference point, such as a reference point on the wafer or of the tool, a plus or minus defocus condition of the lithography tool can be detected.

Figure 4A:
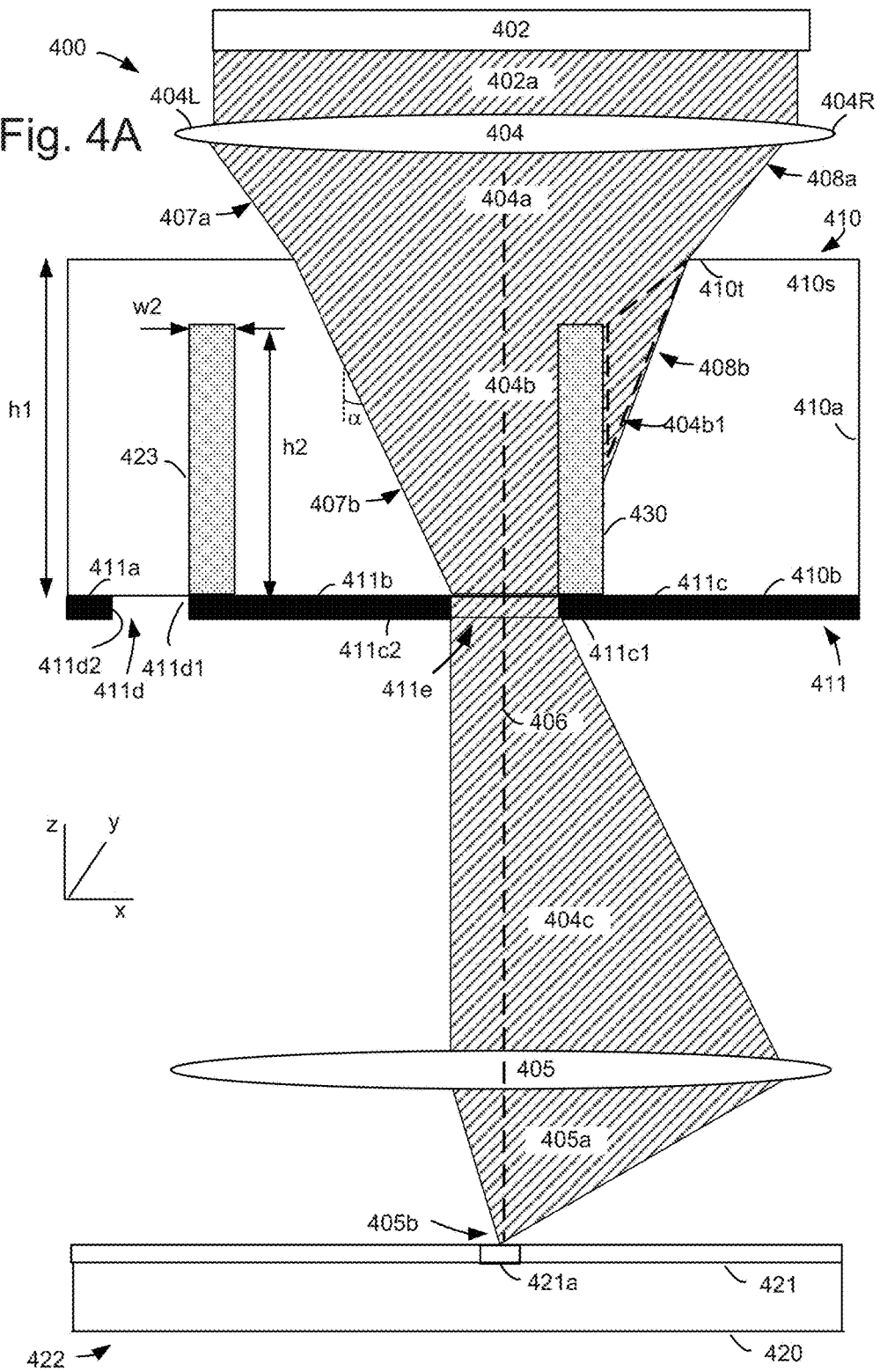
FIG. 4A depicts a lithography apparatus for patterning a substrate using an asymmetric light pattern, where a best focus condition exists, and where a reticle with a bottom opaque material and reduced transmission region is used.

FIG. 4A depicts a lithography apparatus for patterning a substrate using an asymmetric light pattern, where a best focus condition exists, and where a reticle with a bottom opaque material and reduced transmission region is used. In this example, instead of providing a backside pattern which enables the optical system to be asymmetric, regions with a reduced optical transmission factor (reduced optical transmission regions) are provided in the glass plate. These regions can be provided, e.g., in a focus inspection mark area in the reticle glass and can be considered to be fogged areas which are formed at specific locations in the bulk of the glass plate. One example of a treatment which can provide regions with a reduced transmission factor uses a high energy laser such as a femtosecond laser to introduce minute defects/damaged areas, e.g., voids or cracks, in the reticle glass. An example implementation uses the CDC32 (Critical Dimension Control) system available from Carl Zeiss AG, Oberkochen, Germany. The CDC32 uses an ultrafast femtosecond laser to write intra-volume shading elements inside the bulk material of a mask. This technique can be applied to a reticle glass as described herein. By adjusting the density of the shading elements, the light transmission through the mask can be changed. In particular, the shading elements form a scattering region which tends to scatter the light so that a region is formed with an optical transmission factor which is less than the transmission factor of surrounding areas of the body of the glass plate which were not subject to the treatment. The shading elements can be created, e.g., before or after the opaque material is deposited on the glass plate and patterned. See FIG. 4E for further details.

In this approach, well-defined regions in the glass plate can be provided with a reduced transmission factor. A transmission factor or coefficient is a measure of how much of an electromagnetic wave (light) passes through an optical element. The transmission factor of reticle glass for laser light which is used in a lithography process is usually very high, e.g., almost one. This is an example of a first transmission factor (Tr) of the surrounding region of the glass plate which surrounds the reduced transmission regions. A transmission factor of one means complete transmission, and zero means complete shielding. Due to the creation of the fogged region of the glass plate, the laser light is reflected, scattered or absorbed at the fogged region so that the transmission factor is selectively decreased, e.g., to a value between zero and one. Therefore, we can selectively control the transmission factor of light through the reticle by providing the fogged areas at specified locations throughout the reticle.

For example, if we define Tr as the transmission factor of the light in the reticle glass at a bulk area where a reduced transmission region is not present, and Tf as the transmission factor of the light in the reticle glass at a reduced transmission region, e.g., a fogged area, we have $0<Tf<Tr<1$.

This approach provides opaque material on the bottom of the glass plate of the reticle. Symmetric light enters the glass plate, while regions with a reduced transmission factor in the glass plate essentially partially block portions of the light so that asymmetric light exits the glass plate. The regions with a reduced transmission factor act as a shield to the light. The asymmetric light then reaches the projection lens and the substrate. This allows distinguishing between a plus or minus defocus condition, while avoiding the need for a top opaque material.

The apparatus 400 includes a light source 402 such as a laser which produces light 402a. The light 402a passes through an illumination lens 404 to provide light 404a. This light passes through a reticle 410. In one approach, the reticle comprises a glass plate 410a which includes a top surface 410t, a bottom surface 410b and a bulk or body region 410a. An opaque material 411 such as chrome is formed on the bottom surface of the glass plate. The opaque material, including portions 411a, 411b and 411c, is patterned with openings, such as opening 411d and 411e. The light 404b entering the glass plate is generally symmetric relative to a vertical or central axis 406.

Light 404c exits the glass plate through the opening 411e and reaches a projection lens 405. This light is generally asymmetric relative to the central axis. Light 405a which is output from the lens is focused at the top surface of a wafer 422 at a focal point or plane 405b. The wafer 422 includes a substrate 420 and a photoresist layer 421 on the substrate. A portion 421a of the photoresist is exposed by the light 405a, according to the focal point 405b.

Reduced transmission regions 423 and 430 are also depicted adjacent to sides 411d1 and 411c1 (or edges), respectively, of the openings 411d and 411e, respectively. These regions have a lower transmission factor than the surrounding regions 410s of the glass plate. The transmission factors for the different regions may be equal or otherwise comparable, in one approach. These regions extend upward from the bottom of the glass plate at a perpendicular angle relative to the bottom of the glass plate. Further, a top of each region is below the top of the glass plate. Each region has a height of h2 and a width of w2, while the glass plate has a height of h1. The region 430 is positioned in a location which blocks a portion 404b1 of the light 404b. In one approach, a reduced transmission region is asymmetrically set relative to an opening in the reticle at a side of the opening.

Each side of an opening faces in a direction of the respective opening. For example, the side 411d1 faces the opening 411d in the −x direction, the side 411c1 faces the opening 411e in the −x direction, the side 411d2 faces the opening 411d in the x direction, and the side 411c2 faces the opening 411e in the x direction. The opposing sides of an opening also face on another. For example, the sides 411d1 and 411d2 face one another, and the sides 411c1 and 411c2 face one another.

Lines 408a and 408b represent a first optical path of the light from the light source. Due to different refractive indexes of the glass plate and the region outside the glass plate, the angle of the optical path changes when the light enters the glass plate. In one example, the illumination lens has a numerical aperture (NA) of 0.90, the projection lens has NA=0.93 with ×4 quad-reduction, the reticle is surrounded by air with a refractive index of n=1, and the glass plate has a refractive index of n=1.57 for ArF laser light at 193 nm. In this case, $4 \times n \times \sin \alpha = 0.90$, such that $\sin \alpha = 0.90/(4 \times 1.57) = 0.1433$, and $\alpha = 8.3$ degrees. Also, $\tan \alpha = 0.1459$.

The region 430 may be a first reduced transmission region with a second transmission factor (Tf). The opening 411e may be a first opening which is formed in the opaque material. The first reduced transmission region is along the first optical path in the glass plate, where the first optical path extends between the top surface 410t and the first opening 411e, at a non-perpendicular angle relative to the bottom surface 410b of the glass plate, and without crossing directly over the first opening. Further, the first optical path extends to one side 404R of the illumination lens 404 above the glass plate.

The region 423 may be a second reduced transmission region with the second transmission factor (TO.

Lines 407a and 407b represent a second optical path of the light from the light source. The first reduced transmission region is not along the second optical path. The second optical path extends between the top surface 410t and the first opening 411e, at a non-perpendicular angle relative to the bottom surface 410b of the glass plate, without crossing directly over the first opening and without passing through the first reduced transmission region. Further, the second optical path extends to another side 404L of the illumination lens 404 above the glass plate.

Figure 4B:
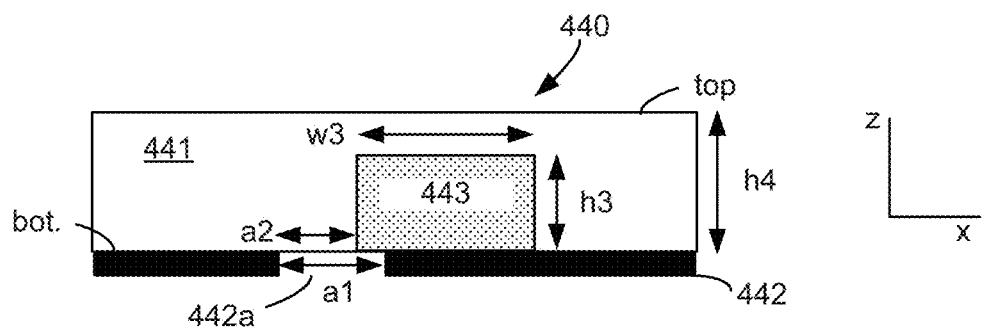
FIG. 4B depicts an example cross-sectional view of a reticle comprising a reduced transmission region.
Figure 4C:
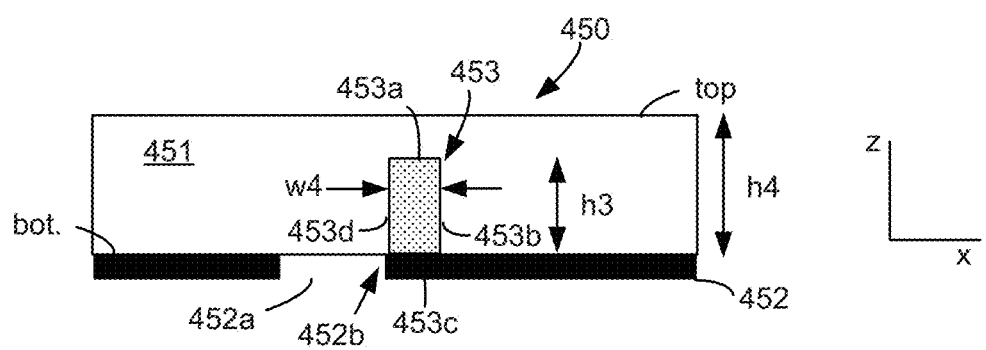
FIG. 4C depicts another example cross-sectional view of a reticle comprising a reduced transmission region.
Figure 4D:
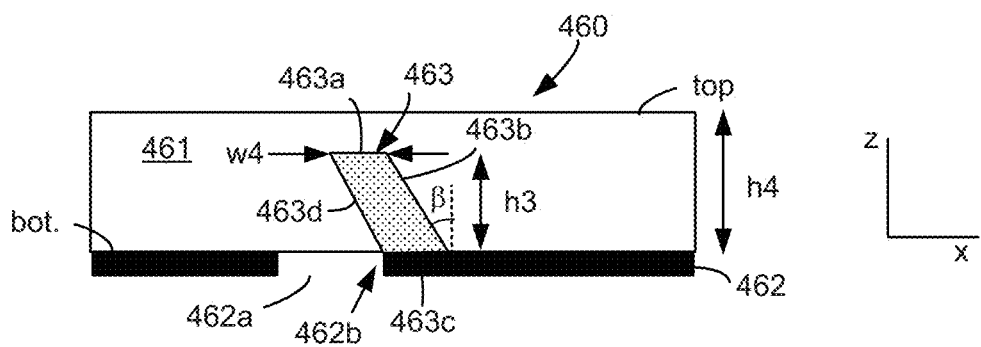
FIG. 4D depicts another example cross-sectional view of a reticle comprising a reduced transmission region, where the reduced transmission region extends on a slant.

With the apparatus of FIG. 4A, the results of FIGS. 3B, 3C and 3D can be obtained. FIG. 4B-4D depicts various configurations of a reduced transmission region. Many other examples are possible. An optimal configuration can depend on various factors. In these example, a width of the reduced transmission region in the x direction is constant. In practice, the width can vary. Moreover, these examples depict one reduced transmission region which shields one opening. It is also possible to have multiple reduced transmission regions which shield one opening.

FIG. 4B depicts an example cross-sectional view of a reticle comprising a reduced transmission region. The reticle 440 comprises a glass plate 441 of height h4, having a top and bottom (bot.), a reduced transmission region 443 of height h3 and width w3, and an opaque material 442 with an opening 442a with a width al. The reduced transmission region 443 is an example of a first reduced transmission region which overlaps a first opening 442a. Also, h4>h3.

FIG. 4C depicts another example cross-sectional view of a reticle comprising a reduced transmission region. The reticle 450 comprises a glass plate 451 of height h4, having a top and bottom (bot.), a reduced transmission region 453 of height h3 and width w3, and an opaque material 452 with an opening 452a. The reduced transmission region 453 is an example of a first reduced transmission region which is adjacent to, and does not overlap, a first opening 452a. The reduced transmission region is adjacent to a side 452b of the opening. The reduced transmission region has a bottom surface 453c which is adjacent to the opaque material 452. The reduced transmission region extends upwardly in the glass plate from the bottom surface of the glass plate at the one side 452b of the first opening. The reduced transmission region further includes vertical sides 453d and 453b which extend at a perpendicular angle from the bottom surface of the glass plate, and a top surface 453a which is parallel the bottom surface of the glass plate, in one possible implementation.

FIG. 4D depicts another example cross-sectional view of a reticle comprising a reduced transmission region, where the reduced transmission region extends on a slant at an angle of beta which is between 0 and 90 degrees. The reticle 460 comprises a glass plate 461 of height h4, having a top and bottom (bot.), a reduced transmission region 463 of height h3 and width w3, and an opaque material 462 with an opening 462a. The reduced transmission region 463 is another example of a first reduced transmission region which is adjacent to, and does not overlap, a first opening 462a. The reduced transmission region is adjacent to a side 462b of the opening.

The reduced transmission region has a bottom 463c which is adjacent to the opaque material 462. The reduced transmission region extends upwardly in the glass plate from the bottom surface of the glass plate at the one side 462b of the first opening. The reduced transmission region further includes slanted sides 463d and 463b which extend at a non-perpendicular angle from the bottom surface of the glass plate, and a top surface 463a which is parallel the bottom surface of the glass plate, in one possible implementation.

Figure 8A:
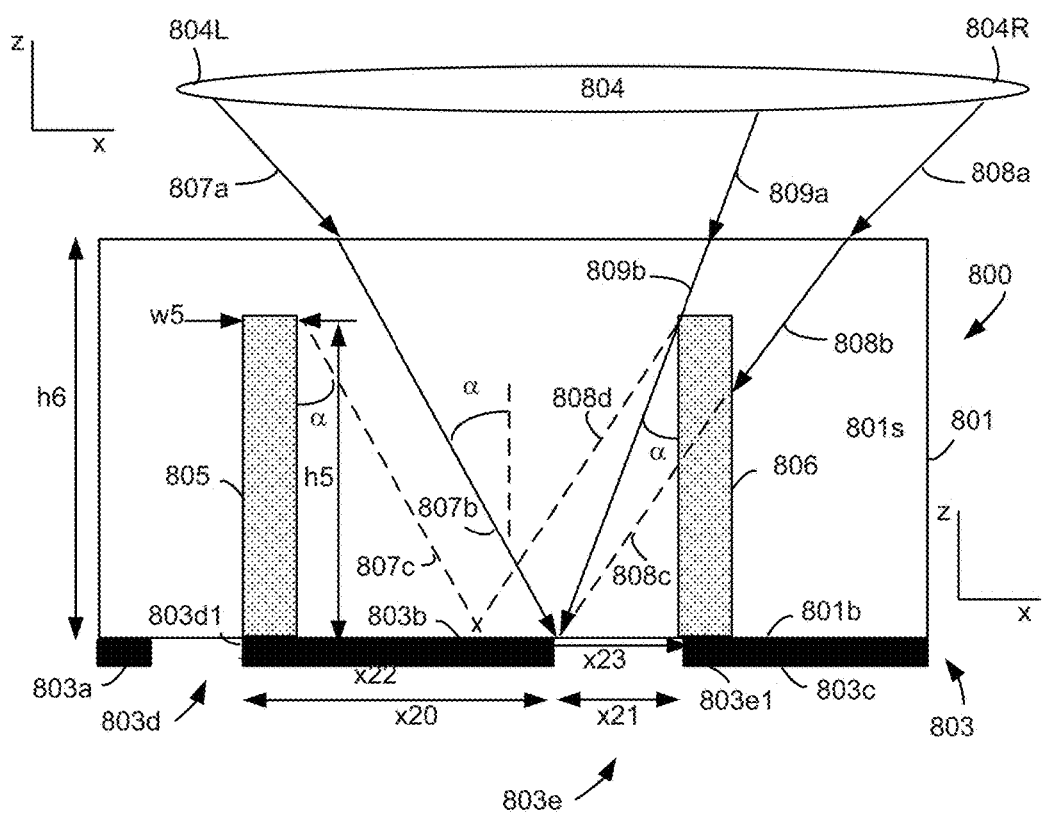
FIG. 8A depicts an example path of light in a reticle having reduced transmission regions which extend upward at a perpendicular angle from a bottom of the reticle and from a side of an opening of the reticle.
Figure 8B:
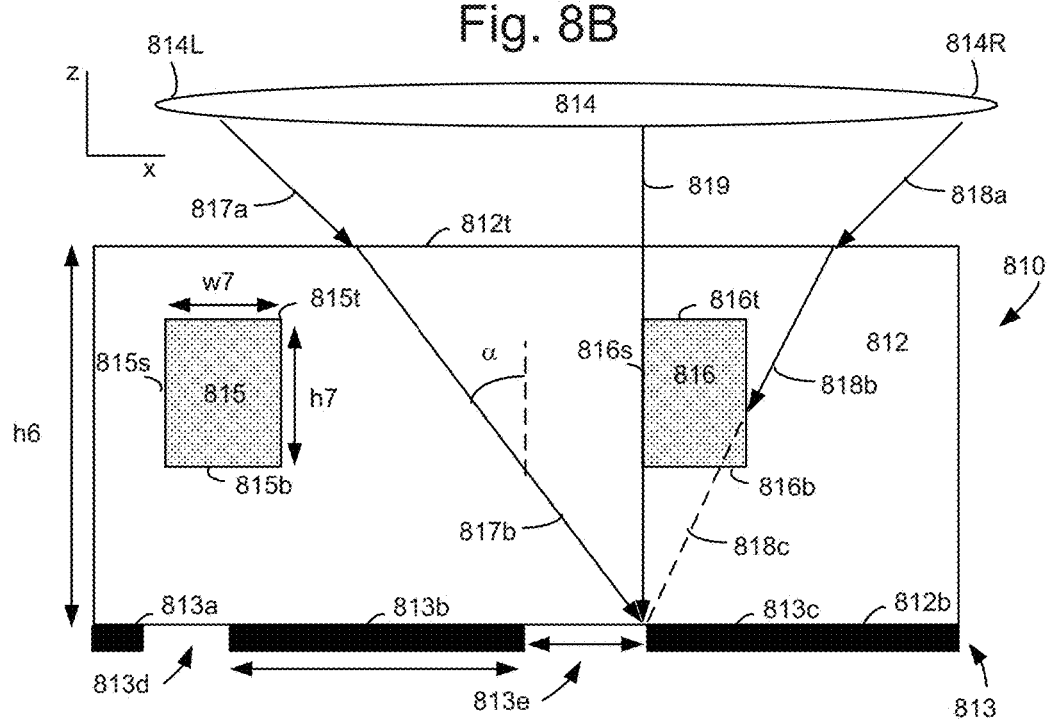
FIG. 8B depicts an example path of light in a reticle having reduced transmission regions, where a bottom of the reduced transmission regions is above a bottom surface of the reticle and the reduced transmission regions have vertical sides.
Figure 8C:
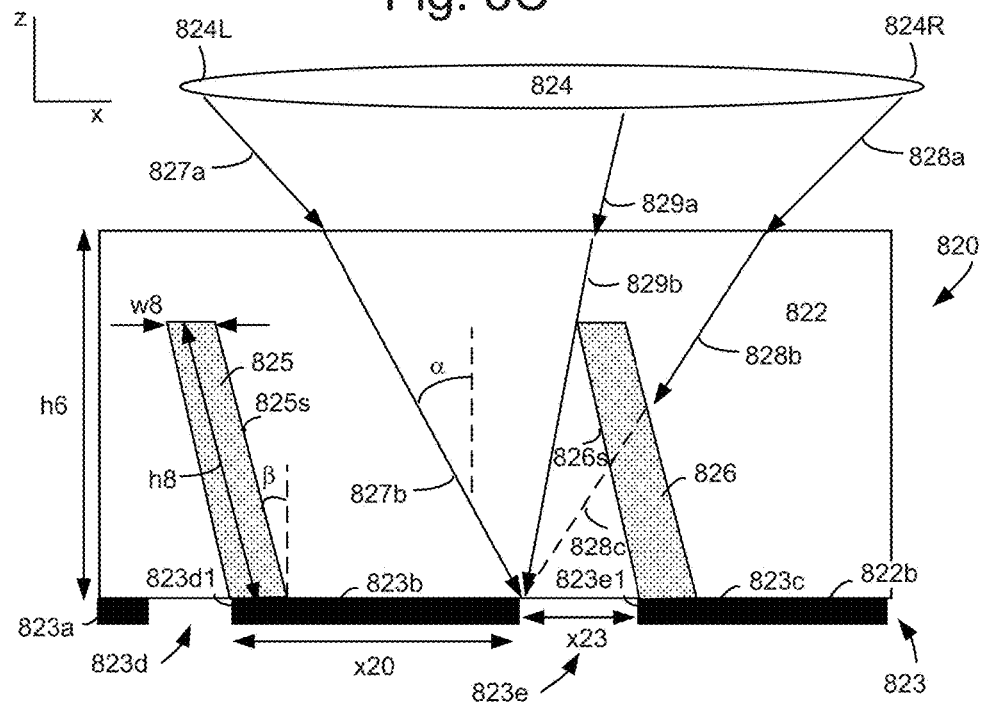
FIG. 8C depicts an example path of light in a reticle having reduced transmission regions which extend upward at a non-perpendicular angle from a bottom of the reticle and from a side of an opening of the reticle.

See also FIG. 8A-8C for further examples and details of optical paths in a reticle having reduced transmission regions.

FIG. 4E depicts a perspective view of a reduced transmission region of a reticle, showing a plurality of elements arranged in arrays of elements. For example, the elements may be the above-mentioned shading elements. The reduced transmission region 470 includes a plurality of elements 471. In one approach, the elements are arranged in arrays or grids such as an example array 472. The elements may be formed in columns 473 and rows 474. In this figure, some elements are omitted for clarity but the elements may be provided uniformly through a volume of the reduced transmission region, in one approach. In another approach, the elements are provided non-uniformly. For example some arrays may have more elements than other arrays, and some elements in an array may be closer together than other elements in an array. Moreover, within an array, some rows may have more elements than other rows.

In one approach, high power, ultra small laser spots or pulses of femtosecond duration are focused through the back of the reticle to create the elements at a given height in the reticle. The back or top of the reticle is opposite the patterned opaque material so that the elements may advantageously be formed after the opaque material is patterned. Further, the elements may advantageously be formed in a previously fabricated reticle.

Each laser pulse creates a microscopic optical shading element. The density of the elements in an array defines the attenuation level, where the attenuation level is proportional to the density.

An element may be elongated along the z axis, which is the axis of travel of the laser pulse. The laser may then be shifted to a new position relative to the reticle (by movement of the laser or the reticle) where a new pulse of light is emitted to create a new element. In one approach, an array of elements is created at a given height in the reticle by shifting the relative laser position along uniform rows. The laser can then be focused to a different, higher height in the reticle and the process repeated to form another array of elements without interfering with the previously created array. This can be repeated until all of the desired elements are created. Different arrays of elements may be superimposed. Moreover, when multiple reduced transmission regions are to be formed, one approach is to form the arrays of multiple reduced transmission regions at a given height before forming a next array at a next higher height, as discussed further in connection with FIG. 4H. Another approach is to form the arrays of one reduced transmission region at multiple heights before forming a next reduced transmission region, starting again at the lowest height, as discussed further in connection with FIG. 4G.

FIG. 4F depicts the formation of elements in the reticle 450 of FIG. 4C. A portion 450a of the reticle is depicted. A femtosecond laser 449 which produces a light pulse 449a, as discussed, may be used. Note that this is different than the laser which provides the light source to the reticle during the patterning of the substrate. Example elements are represented by ovals. The z axis depicts a height in the reduced transmission region 453 and the x axis depicts a lateral position in the reduced transmission region. In this simplified example, four rows of elements are provided, e.g., at heights of 0, h3x.33, h3x.66 and h3. Also, four columns of elements are provided, e.g., lateral positions of 0, w4x.33, w4x.66 and w4. In this example, the elements in the bottom row have been formed and two of the elements in the next higher row have been formed.

Figure 4G:
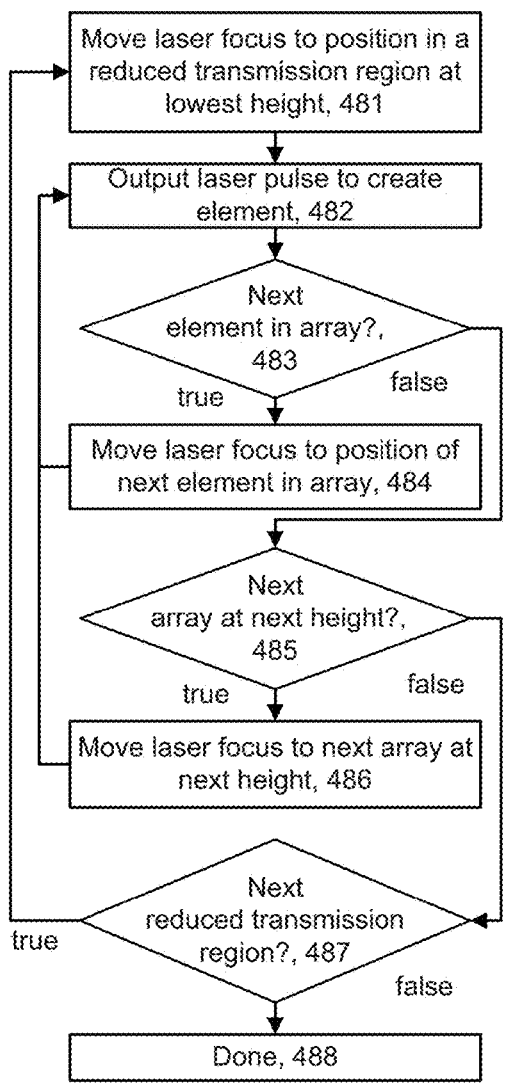
FIG. 4G depicts an example process for forming elements, one reduced transmission region at a time.

FIG. 4G depicts an example process for forming elements, one reduced transmission region at a time. Step 481 moves the laser focus to a position in a reduced transmission region at a lowest height, e.g., at z=0 in FIG. 4F. Step 482 outputs a laser pulse at the focus position to form an element. A decision step 483 determines if there is a next element to be formed in the current array. If decision step 483 is true, step 484 moves the laser focus to a position where the next element in the array is to be created. If decision step 483 is false, a decision step 485 determines whether there is a next array to be formed at a next height in the current reduced transmission region. If decision step 485 is true, step 486 moves the laser focus to the next array at the next height where the next element is to be created. If decision step 485 is false, the current reduced transmission region has been completely formed, and decision step 487 determines whether there is a next reduced transmission region to form. If decision step 487 is true, the process continues at step 481, where the laser focus is moved the next reduced transmission region at a lowest height in next reduced transmission region. If decision step 487 is false, the process is done at step 488.

Figure 4H:
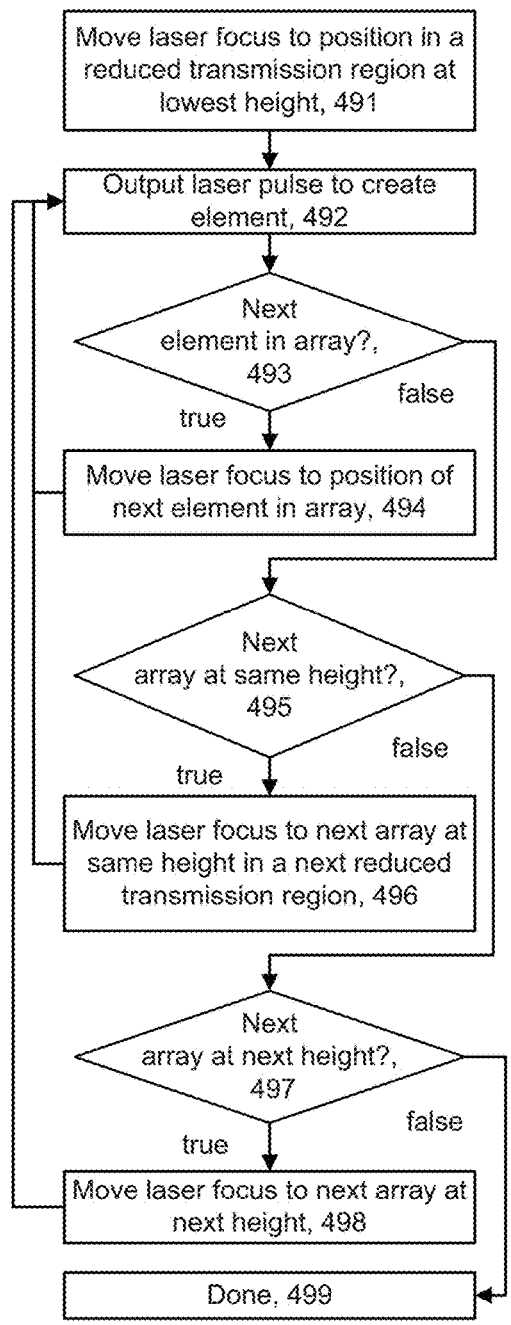
FIG. 4H depicts an example process for forming elements, one height at a time.

FIG. 4H depicts an example process for forming elements, one height at a time. Step 491 moves the laser focus to a position in a reduced transmission region at a lowest height, e.g., at z=0 in FIG. 4F. Step 492 outputs a laser pulse at the focus position to form an element. A decision step 493 determines if there is a next element to be formed in the current array. If decision step 493 is true, step 494 moves the laser focus to a position where the next element in the array is to be created. If decision step 493 is false, a decision step 495 determines whether there is a next array to be formed at a same height in another reduced transmission region. If decision step 495 is true, step 496 moves the laser focus to the next array at the same height in a next reduced transmission region where the next element is to be created. If decision step 495 is false, a decision step 497 determines whether there is a next array at a next height to form. If decision step 497 is true, the process continues at step 498, where the laser focus is moved the next array at the next height. If decision step 497 is false, the process is done at step 499.

FIG. 5A depicts a top view of an example reticle 500 comprising reduced transmission regions 505a, 506a, 507a and 508a adjacent to respective slits 505, 506, 507 and 508 where the reduced transmission regions are on a same side of the respective slits. For example, the reduced transmission regions 506a and 507a are on the right side of slits 506 and 507, respectively, and the reduced transmission regions 505a and 508a are above slits 505 and 508, respectively, in this top view. In other words, the reduced transmission regions 506a and 507a have a larger x-axis position than the slits 506 and 507, respectively, and the reduced transmission regions 505a and 508a have a larger y-axis position than the slits 505 and 508, respectively, in this top view. Openings, e.g., slits, 501, 502, 503 and 504 which do not have associated reduced transmission regions are also depicted.

In an example design, each slit has a width of 1 µm, the slits 502 and 506, and 507 and 503 are separated by 7 µm and the slits 506 and 507 are separated by 11 µm.

FIG. 5B depicts a cross-sectional view of the reticle of FIG. 5A along line 509. The reticle includes reduced transmission regions 506a and 507a, and an opaque material 513 with openings 502, 506, 507 and 503. The reduced transmission regions 506a and 507a are adjacent to the openings 506 and 507, respectively. The opening 506 includes opposing sides 506a1 and 506a2 which face one another, and the opening 507 includes opposing sides 507a1 and 507a2 which face one another.

FIG. 5C depicts a pattern 520 such as an inspection mark on a substrate formed using the reticle of FIG. 5A, where a best focus condition exists. Patterns 521 and 525 are formed by light from openings 501 and 505, respectively, and are spaced apart by a distance y10. Patterns 524 and 528 are formed by light from openings 504 and 508, respectively, and are also spaced apart by y10. Patterns 522 and 526 are formed by light from openings 502 and 506, respectively, and are spaced apart by a distance x10. Patterns 523 and 527 are formed by light from openings 503 and 507, respectively, and are also spaced apart by x10.

FIG. 5D depicts a pattern such as an inspection mark on a substrate 520a formed using the reticle of FIG. 5A, where a minus focus condition exists. In the minus focus condition, the pattern shifts in a direction of the reduced transmission region. See also FIG. 3C. The dashed lines represent the best focus patterns of FIG. 5C for reference. In particular, the shifted pattern 525a is provided in place of the best focus pattern 525, and is spaced apart from the pattern 521 by y11<y10. The shifted pattern 526a is provided in place of the best focus pattern 526, and is spaced apart from the pattern 522 by x11>x10. The shifted pattern 528a is provided in place of the best focus pattern 528, and is spaced apart from the pattern 524 by y12>y10. The shifted pattern 527a is provided in place of the best focus pattern 527, and is spaced apart from the pattern 523 by x12<x10. The minus focus condition can therefore be detected by observing the positions of the patterns which are formed using the reduced transmission regions.

FIG. 5E depicts a pattern such as an inspection mark on a substrate 520b formed using the reticle of FIG. 5A, where a plus focus condition exists. In the plus focus condition, the pattern shifts in a direction away from the reduced transmission region. See also FIG. 3B. The dashed lines represent the best focus patterns of FIG. 5C for reference. The shifted pattern 525b is provided in place of the best focus pattern 525, and is spaced apart from the pattern 521 by y14>y10. The shifted pattern 526b is provided in place of the best focus pattern 526, and is spaced apart from the pattern 522 by x13<10. The shifted pattern 528b is provided in place of the best focus pattern 528, and is spaced apart from the pattern 524 by y15<y10. The shifted pattern 527b is provided in place of the best focus pattern 527, and is spaced apart from the pattern 523 by x14>10. The plus focus condition can therefore be detected by observing the positions of the patterns which are formed using the reduced transmission regions.

In the examples of FIGS. 5D and 5E, the positions of the patterns which are formed using openings which do not have an associated reduced transmission region are not shifted on the substrate, but may be widened, when there is a defocus condition. As a result, the change in the distance between a pattern which is formed using an opening which does not have an associated reduced transmission region (a non-shielded opening) and a pattern which is formed using an opening which has an associated reduced transmission region (a shielded opening) is due mainly to a shift of the latter pattern.

In the examples of FIG. 6A-6E, each opening in the reticle has an associated reduced transmission region. Moreover, the reduced transmission regions can be positioned to provide a larger shift in the relative positions of the patterns so that the shift can be more easily observed.

Figure 6A:
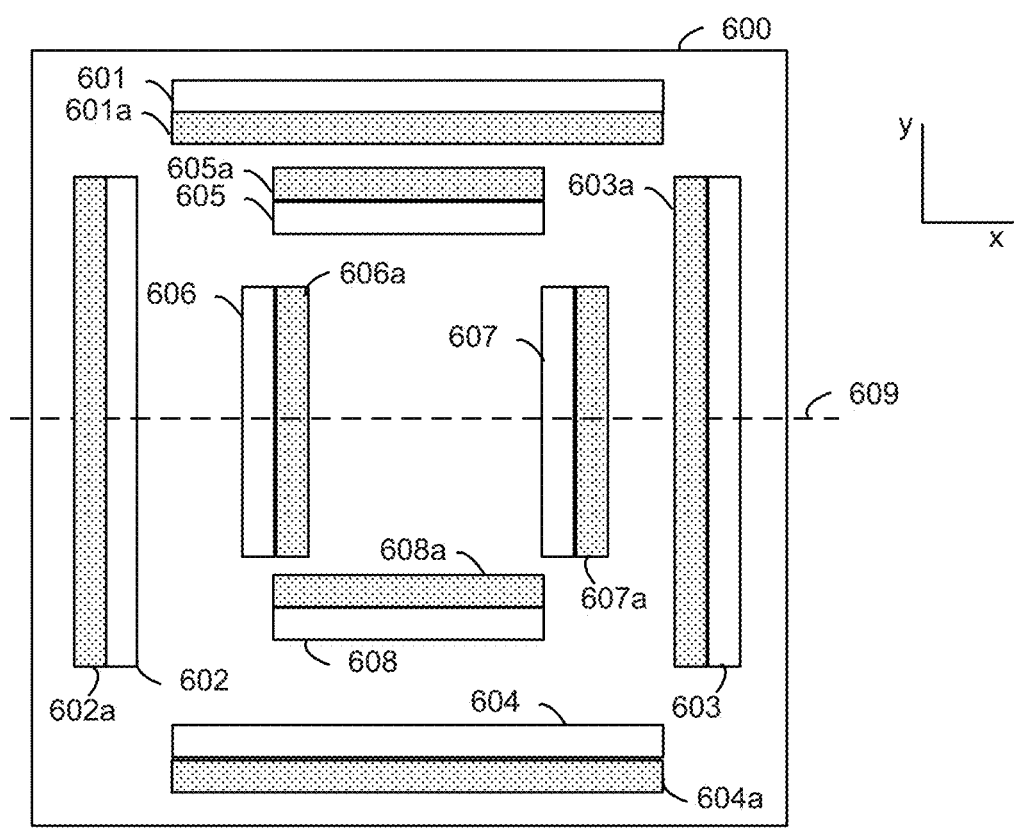
FIG. 6A depicts a top view of another example reticle comprising reduced transmission regions adjacent to respective slits, where the reduced transmission regions are on opposite sides of the respective slits.

FIG. 6A depicts a top view of another example reticle 600 comprising reduced transmission regions 601a, 602a, 603a, 604a, 605a, 606a, 607a and 608a adjacent to respective slits 601, 602, 603, 604, 605, 606, 607 and 608, respectively, where the reduced transmission regions are on opposite sides of the respective slits. For example, the reduced transmission regions 606a and 607a are on the right side of slits 606 and 607, respectively, and the reduced transmission regions 602a and 603a are on the left side of slits 602 and 603, respectively, in this top view. In other words, the reduced transmission regions 606a and 607a have a larger x-axis position than the slits 606 and 607, respectively, and the reduced transmission regions 602a and 603a have a smaller x-axis position than the slits 602 and 603, respectively.

Similarly, the reduced transmission regions 601a and 604a are below the slits 601 and 604, respectively, and the reduced transmission regions 605a and 608a are above the slits 605 and 608, respectively, in this top view. In other words, the reduced transmission regions 601a and 604a have a smaller y-axis position than the slits 601 and 604, respectively, and the reduced transmission regions 605a and 608a have a larger y-axis position than the slits 605 and 608, respectively.

Figure 6B:
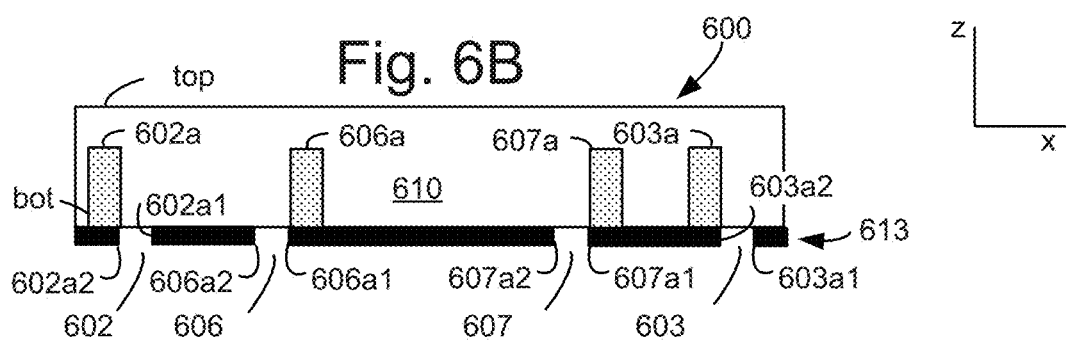
FIG. 6B depicts a cross-sectional view of the reticle of FIG. 6A along line 609.

FIG. 6B depicts a cross-sectional view of the reticle of FIG. 6A along line 609. The reticle includes a glass plate 610, reduced transmission regions 602a, 606a, 607a and 603a adjacent to openings 602, 606, 607 and 603, respectively, in an opaque material 613. In this arrangement, the light which exits each opening of the reticle has an asymmetric intensity, and the asymmetry is opposite for light from openings 602 and 606, and from openings 607 and 603.

The opening 602 includes opposing sides 602a1 and 602a2 which face one another, the opening 606 includes opposing sides 606a1 and 606a2 which face one another, the opening 607 includes opposing sides 607a1 and 607a2 which face one another, and the opening 603 includes opposing sides 603a1 and 603a2 which face one another. Further, the sides 602a2, 606a2, 607a2 and 603a2 face in the x direction and the sides 602a1, 606a1, 607a1 and 603a1 face in the −x direction.

FIG. 6C depicts a pattern 620 such as an inspection mark on a substrate formed using the reticle of FIG. 6A, where a best focus condition exists. Patterns 621 and 625 are formed by light from openings 601 and 605, respectively, and are spaced apart by a distance y15. Patterns 624 and 628 are formed by light from openings 604 and 608, respectively, and are also spaced apart by y15. Patterns 622 and 626 are formed by light from openings 602 and 606, respectively, and are spaced apart by a distance x15. Patterns 623 and 627 are formed by light from openings 603 and 607, respectively, and are also spaced apart by x15.

FIG. 6D depicts a pattern 620a such as an inspection mark on a substrate formed using the reticle of FIG. 6A, where a minus focus condition exists. The dashed lines represent the best focus patterns of FIG. 6C for reference. In particular, the shifted patterns 621a, 625a, 622a, 626a, 624a, 628a, 623a and 627a are provided in place of the respective best focus patterns. Moreover, the patterns 621a and 625a are spaced apart by $y16<y15$, the patterns 622a and 626a are spaced apart by $x16>x15$, the patterns 624a and 628a are spaced apart by $y17>y15$, and the patterns 623a and 627a are spaced apart by $x17<x15$. Further, comparing FIGS. 6D and 5D, $y16<y11$, $x16>x11$, $y17>y12$ and $x17<x12$. Thus, the shifting of both patterns in a pair of adjacent patterns either toward or away from one another results in a larger shift compared to FIG. 5D. This makes it easier to detect the defocus condition.

Thus, to improve the focus position sensitivity to the pattern's lateral shift, the side of the reticle opening on which the reduced transmission region is provided may be reversed between the inner mark and the outer mark, as shown in FIG. 6A. In case of a focus shift to minus, the inner marks shift to the right and up and the outer marks shift to the left and down. In case of a focus shift to plus, the inner marks shift to the left and down and the outer marks shift to the right and up. This approach doubles the focus sensitivity compared to FIG. 5A.

FIG. 6E depicts a pattern 620b such as an inspection mark on a substrate formed using the reticle of FIG. 6A where a plus focus condition exists. The dashed lines represent the best focus patterns of FIG. 6C for reference. In particular, the shifted patterns 621b, 625b, 622b, 626b, 624b, 628b, 623b and 627b are provided in place of the respective best focus patterns. Moreover, the patterns 621b and 625b are spaced apart by $y18>y15$, the patterns 622b and 626b are spaced apart by $x18<x15$, the patterns 624b and 628b are spaced apart by $y19<y15$, and the patterns 623b and 627b are spaced apart by $x19>x15$. Further, comparing FIGS. 6E and 5E, $y18>y14$, $x18<x13$, $y19<y15$ and $x19>x14$. Thus, the shifting of both patterns in a pair of adjacent patterns either toward or away from one another results in a larger shift compared to FIG. 5E.

Figure 7A:
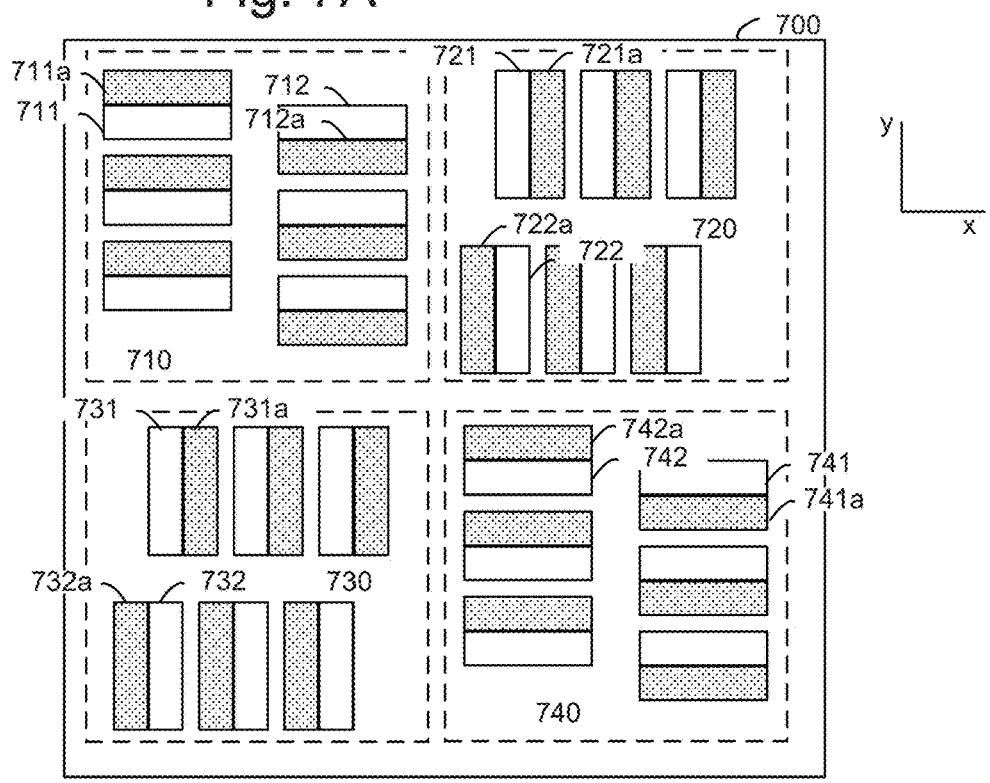
FIG. 7A depicts a top view of an example reticle comprising reduced transmission regions adjacent to respective slits, where the reduced transmission regions and the respective slits are arranged in different sets.

FIG. 7A depicts a top view of an example reticle 700 comprising reduced transmission regions adjacent to respective slits, where the reduced transmission regions and the respective slits are arranged in different sets. The use of redundant patterns with associated reduced transmission regions can make it easier to detect the defocus condition because a redundant pattern shift will be formed on the substrate. A redundant pattern shift is easier to detect than a non-redundant pattern shift. Each set of openings includes six openings, as an example. Set 710 includes example openings 711 and 712 and associated reduced transmission regions 711a and 712a, respectively. Set 720 includes example openings 721 and 722 and associated reduced transmission regions 721a and 722a, respectively. Set 730 includes example openings 731 and 732 and associated reduced transmission regions 731a and 732a, respectively. Set 740 includes example openings 741 and 742 and associated reduced transmission regions 741a and 742a, respectively.

Moreover, each pair of openings is aligned with one another. For example, the openings 711 and 712 are aligned along an axis parallel to the x-axis and may have a common thickness along the y-axis. The openings 741 and 742 are aligned along an axis parallel to the x-axis and may have a common thickness along the y-axis. The openings 712 and 721 are aligned along an axis parallel to the y-axis and may have a common thickness along the x-axis. The openings 731 and 732 are aligned along an axis parallel to the y-axis and may have a common thickness along the x-axis.

Figure 7B:
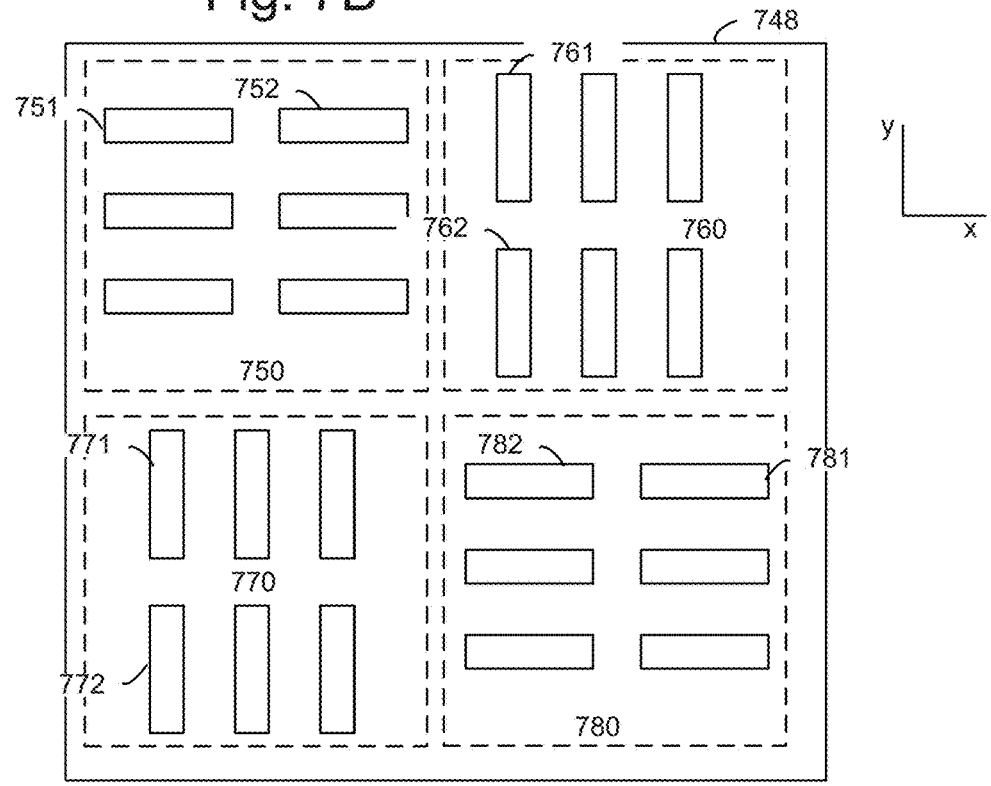
FIG. 7B depicts a pattern on a substrate formed using the reticle of FIG. 7A, where a best focus condition exists.

FIG. 7B depicts a pattern 748 such as an inspection mark on a substrate formed using the reticle of FIG. 7A, where a best focus condition exists. The substrate 748 includes sets of patterns corresponding to the sets in the reticle of FIG. 7A. Sets 750, 760, 770 and 780 include example patterns 751, 761, 771 and 781, respectively. The alignment of the pairs of patterns indicates the best focus condition exists.

Figure 7C:
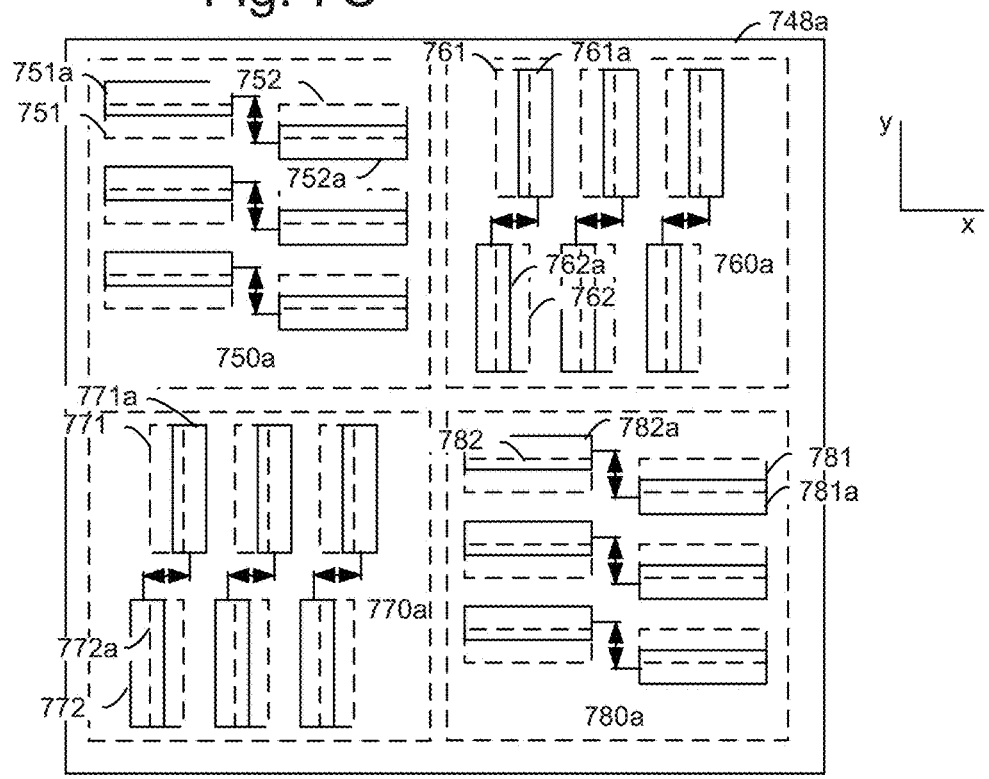
FIG. 7C depicts a pattern on a substrate formed using the reticle of FIG. 7A, where a minus focus condition exists.

FIG. 7C depicts a pattern 748*a* such as an inspection mark on a substrate formed using the reticle of FIG. 7A, where a minus focus condition exists. The dashed lines represent the best focus patterns of FIG. 7B for reference. The substrate 748*a* includes sets of patterns corresponding to the sets in the reticle of FIG. 7A. In set 750*a*, shifted patterns 751*a* and 752*a* which are shifted in the +y and −y directions, respectively, are provided in place of best focus patterns 751 and 752, respectively. In set 780*a*, shifted patterns 782*a* and 781*a* which are shifted in the +y and −y directions, respectively, are provided in place of best focus patterns 781 and 782, respectively. In set 760*a*, shifted patterns 761*a* and 762*a* which are shifted in the +x and −x directions, respectively, are provided in place of best focus patterns 761 and 762, respectively. In set 770*a*, shifted patterns 771*a* and 772*a* which are shifted in the +x and −x directions, respectively, are provided in place of best focus patterns 771 and 772, respectively. In each case, the shifted patterns are shifted in opposite directions so that the shift can be more easily seen. This approach doubles the focus sensitivity.

Figure 7D:
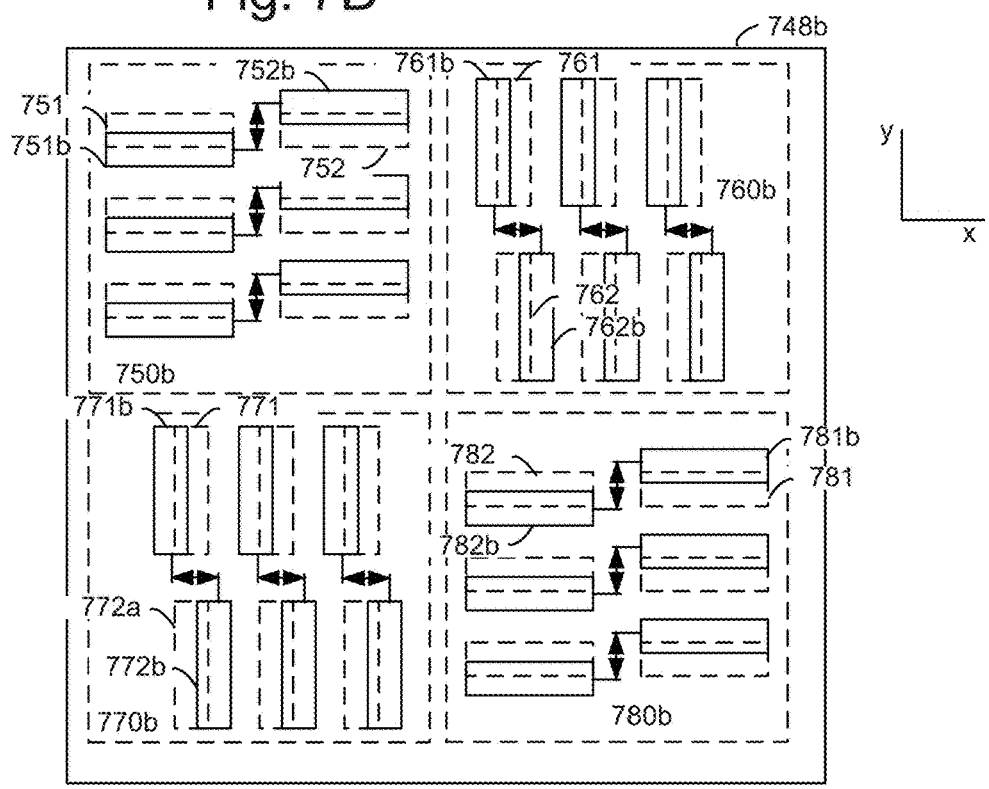
FIG. 7D depicts a pattern on a substrate formed using the reticle of FIG. 7A, where a plus focus condition exists.

FIG. 7D depicts a pattern 748*b* such as an inspection mark on a substrate formed using the reticle of FIG. 7A, where a plus focus condition exists. The dashed lines represent the best focus patterns of FIG. 7B for reference. The substrate 748*a* includes sets of patterns corresponding to the sets in the reticle of FIG. 7A. In set 750*b*, shifted patterns 751*b* and 752*b* which are shifted in the −y and +y directions, respectively, are provided in place of best focus patterns 751 and 752, respectively. In set 780*b*, shifted patterns 782*b* and 781*b* which are shifted in the −y and +y directions, respectively, are provided in place of best focus patterns 781 and 782, respectively. In set 760*b*, shifted patterns 761*b* and 762*b* which are shifted in the −x and +x directions, respectively, are provided in place of best focus patterns 761 and 762, respectively. In set 770*b*, shifted patterns 771*b* and 772*b* which are shifted in the −x and +x directions, respectively, are provided in place of best focus patterns 771 and 772, respectively. In each case, the shifted patterns are shifted in opposite directions so that the shift can be more easily seen. Further, the direction of the shift in FIG. 7C is opposite to that in FIG. 7D so that the plus or minus defocus condition can be distinguished.

FIG. 8A-8C depicts further examples of different configurations of a reticle with reduced transmission regions, showing optical paths in the reticle.

FIG. 8A depicts an example path of light in a reticle 800 having reduced transmission regions 805 and 806 which extend upward at a perpendicular angle from a bottom surface 801*b* of the glass plate 801 of the reticle and from a side 803*d*1 or 803*e*1 of an opening 803*d* or 803*e* of the reticle. A region 801*s* is a surrounding region of the glass plate which surrounds the reduced transmission regions. The openings are formed in an opaque material 803 which includes portions 803*a*, 803*b* and 803*c*. The light which enters the reticle from the illumination lens 804 can be considered to have many optical paths. One example optical path extends from one side 804L of the illumination lens, and is represented by lines 807*a* and 807*b*. Another path extends from another side 804R of the illumination lens, and is represented by lines 808*a*, 808*b* and 808*c*. An additional path is represented by line 809*a* and 809*b*. The reduced transmission regions have a height h5 and a width w5, while the height of the glass plate is h6>h5. The optical path 807*b* is at an angle alpha to a dashed line which is perpendicular to the bottom surface 801*b*.

In this configuration, the optical path 807*b* travels unimpeded by a reduced transmission region to the opening 803*e*. This example path reaches the left hand side of the opening. Other optical paths will reach the middle and right hand side of the opening. The optical path 809*b* also travels unimpeded by a reduced transmission region to the opening 803*e*. However, the optical path 808*b* is scattered by the reduced transmission region 806. An attenuated portion of this light may reach the opening 803*e* as the optical path 808*c*. Optical paths between the optical paths 809*b* and 808*b* will similarly be scattered by the reduced transmission region 806. This results in an asymmetric light pattern existing the opening 803*e* as discussed. The reduced transmission region 805 will serve a similar purpose in scattering light when the illumination is directed toward the opening 803*d*.

Each reduced transmission region can have a size and position which blocks a portion of the incident light on one side of the associated opening.

We can further define a line 807*c* which is parallel to the path 807*b* and which touches the upper corner of the reduced transmission region 805. A distance between where the line 807*c* intersects with the bottom surface 801*b* of the glass plate to the side 803*d*1 is x22=w5+h5×tan α. To prevent the light at the opening 803*e* from being shielded by the reduced transmission region 805 of the next opening 803*d*, we may configure the reticle such that x22<x20, as is shown here, where x20, e.g., 11 μm is the distance between adjacent openings. In an example, x22=w5+h5×tan α=3 μm+20 μm×0.1459=5.9 μm<11 μm.

We can further define a line 808*d* which is parallel to the path 808*c* and which touches the upper corner of the reduced transmission region 806. A distance between where the line 808*d* intersects with the bottom surface 801*b* of the glass plate to the side 803*e*1 is x23=h5×tan α. To shield the light using the reduced transmission region 806, we may configure the reticle such that x23>x21, as is shown here. In an example, x23=h5×tan α=20 μm×0.1459=2.9 μm>1 μm.

FIG. 8B depicts an example path of light in a reticle 810 having reduced transmission regions 815 and 816, where a bottom 815*b* and 816*b* of the reduced transmission regions 815 and 816 is above a bottom surface 812*b* of the glass plate 812 of the reticle 810 and the reduced transmission regions have vertical sides 815*s* and 816*s*. The reduced transmission regions 815 and 816 also have tops 815*t* and 816*t*, respectively.

Openings 813*d* and 813*e* are formed in an opaque material 813 which includes portions 813*a*, 813*b* and 813*c*. In light which enters the reticle from the illumination lens 814, one example path extends from one side 814L of the illumination lens, and is represented by lines 817*a* and 817*b*. Another path extends from another side 814R of the illumination lens, and is represented by lines 818*a*, 818*b* and 818*c*. An additional path is represented by line 819, which is perpendicular to the bottom surface of the glass plate. The reduced transmission regions have a height h7 and a width w7, while the height of the glass plate is h6>h7. This is an example of a top of a first reduced transmission region 815 or 816 being below the top surface 812*t* of the glass plate 812. Also, a bottom of a first reduced transmission region is above the bottom surface of the glass plate. The optical path 817*b* is at an angle alpha (α) to a dashed line which is perpendicular to the bottom surface 812*b*.

In this configuration, the optical path 817*b* travels unimpeded by a reduced transmission region to the opening 813*e*. The optical path 819 also travels unimpeded by a reduced transmission region to the opening 803*e*. However, the optical path 818*b* is scattered by the reduced transmission region 816. An attenuated portion of this light may reach the opening 813*e* as the optical path 818*c*. Optical paths between the optical paths 819 and 818*b* will similarly be scattered by the reduced transmission region 816. This results in an asymmetric light pattern existing the opening 813*e*. The reduced transmission region 815 will serve a similar purpose in scattering light when the illumination is directed toward the opening 813*d*.

The reduced transmission regions in this example advantageously have a smaller vertical extent, along the z axis, than in FIG. 8A. This may facilitate the formation of the reduced transmission regions.

FIG. 8C depicts an example path of light in a reticle 820 having reduced transmission regions 825 and 826 which extend upward at a non-perpendicular angle from a bottom surface 822*b* of a glass plate 822 of a reticle 820 and from a side 823*d*1 or 823*e*1 of an opening 823*d* or 823*e* of the reticle. The openings are formed in an opaque material 823 which includes portions 823*a*, 823*b* and 823*c*. In the light which enters the reticle from the illumination lens 824, one example path extends from one side 824L of the illumination lens, and is represented by lines 827*a* and 827*b*. Another path extends from another side 824R of the illumination lens, and is represented by lines 828*a*, 828*b* and 828*c*. An additional path is represented by line 829*a* and 829*b*. The reduced transmission regions have a height h8 and a width w8, while the height of the glass plate is h6>h8. The reduced transmission regions have sides 825*s* and 826*s* which extend at an angle beta ($\beta$) from a dashed line which is perpendicular to the bottom surface of the glass plate. The optical path 827*b* is at an angle alpha to a dashed line which is perpendicular to the bottom surface 822*b*.

In this configuration, the optical paths 827*b* and 829*b* travel unimpeded by a reduced transmission region to the opening 823*e*. However, the optical path 828*b* is scattered by the reduced transmission region 826. An attenuated portion of this light may reach the opening 823*e* as the optical path 828*c*. Optical paths between the optical paths 829*b* and 828*b* will similarly be scattered by the reduced transmission region 826. This results in an asymmetric light pattern existing the opening 823*e* as discussed. The reduced transmission region 825 will serve a similar purpose in scattering light when the illumination is directed toward the opening 823*d*.

Providing the reduced transmission region on a slant may allow a reduced height for the reduced transmission region and a corresponding reduced time in forming the elements of the reduced transmission region.

To prevent the light at the opening 823*d* from being shielded by the reduced transmission region 826 of the next opening 823*e*, we may configure the reticle such that (w8× cos $\beta$)+(h8×cos $\beta$×tan $\alpha$)−(h8×sin $\beta$)<x20. To shield the light using the reduced transmission region 825, we may configure the reticle such that (h8×cos $\beta$×tan $\alpha$)+(h8×sin $\beta$)>x23.

Figure 9A:
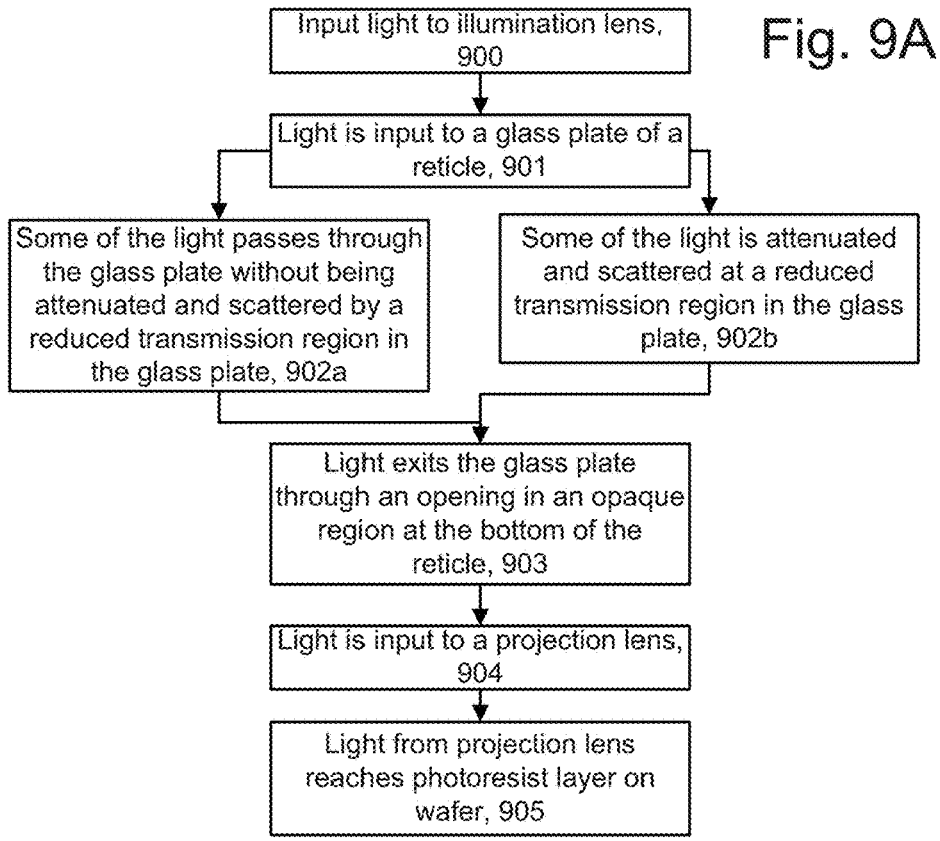
FIG. 9A depicts an example process for using a reticle to form a pattern on a substrate.

FIG. 9A depicts an example process for using a reticle to form a pattern such as an inspection mark on a substrate. Step 900 includes inputting light to an illumination lens. At step 901, the light is input to a glass plate of a reticle. At step 902*a*, some of the light passes through the glass plate without being attenuated and scattered by a reduced transmission region in the glass plate. At step 902*b*, some of the light is attenuated and scattered at a reduced transmission region in the glass plate. At step 903, light exits the glass plate through an opening in an opaque material at the bottom of the reticle. At step 904, the exiting light is input to a projection lens. At step 905, light from the projection lens reaches a photoresist layer on a wafer.

Figure 9B:
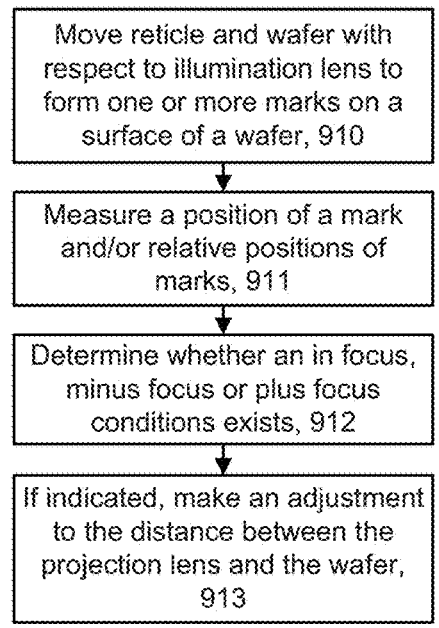
FIG. 9B depicts an example process for adjusting a focus condition using a reticle.

FIG. 9B depicts an example process for adjusting a focus condition using a reticle. Step 910 includes moving a reticle and a wafer with respect to an illumination lens to form one or more marks, e.g., patterns, on a surface of a wafer. Step 911 includes measuring a position of a mark and/or relative positions of marks, e.g., as discussed in connection with FIGS. 5C-5E, 6C-6E and 7B-7D. For example, the substrate can be viewed using a scanning electron microscope or other optical measurement tool. A manual and/or automated process can be used. In one approach, a machine vision process can be used to automatically identify the marks and their relative positions. Step 912 determines whether an in focus, minus focus or plus focus conditions exists. The extent of the minus focus or plus focus condition can also be determined. This can be done based on the absolute or relative positions of the marks, as discussed. Step 913 includes, if indicated, making an adjustment to the distance between the projection lens and the wafer. The distance should be decreased or increased, respectively, if a plus or minus defocus condition exists.

The overlay inspection mark may be applied as a focus inspection mark as shown in FIG. 5. In case of a focus shift to minus, the inner mark will shift to the upper right in the lateral direction. Then, we can detect the focus error by using an overlay inspection.

In a case where the focus error is detected, the resist mask can be reworked and/or the nature of the error can be fed-back to the exposure machine.

This technology enables measurement of the focus position after a lithography process inspection in production. The cost of the technology is lower than previous approaches.

In one embodiment, a reticle comprises a glass plate comprising a top surface and a bottom surface, the glass plate comprising a region with a first transmission factor and a first reduced transmission region with a second transmission factor, which is lower than the first transmission factor; and an opaque material on the bottom surface of the glass plate, wherein a first opening is formed in the opaque material, and the first reduced transmission region is along a first optical path in the glass plate, the first optical path extends between the top surface and the first opening, at a non-perpendicular angle relative to the bottom surface of the glass plate, and without crossing directly over the first opening.

In an example implementation, the glass plate comprises a second reduced transmission region with a second transmission factor, which is lower than the first transmission factor; a second opening is formed in the opaque material; the first opening comprises a side facing in a first direction and an opposing side facing in a second direction, opposite the first direction; the second opening comprises a side facing in the first direction and an opposing side facing in the second direction; the first reduced transmission region is adjacent to the side of the first opening facing in the first direction; and the second reduced transmission region is adjacent to the side of the second opening facing in the second direction.

In an example implementation, the first reduced transmission region comprises a plurality of elements having a refractive index different than a refractive index of the region with the first transmission factor.

In another embodiment, a reticle comprises a glass plate comprising a top surface and a bottom surface; an opaque material on the bottom surface of the glass plate, the opaque material having an opening; and a scattering region in the glass plate, the scattering region comprising a plurality of elements arranged in a plurality of arrays, the elements having a refractive index different than a refractive index of a surrounding portion of the glass plate which surrounds the plurality of elements, rows of elements of the plurality of elements extend laterally in the glass plate in each array of the plurality of arrays, and the scattering region is positioned adjacent to one side of the opening to shield the one side of the opening from light which enters at the top surface.

In another embodiment, a method for patterning a wafer comprises: forming a first mark (521-528) on a surface (101, 131) of the wafer (222, 322, 422) using a pattern in a reticle (410, 440, 450, 460), the reticle comprising a glass plate (441, 451, 461, 510, 610, 801, 812, 822) and an opaque material (411, 442, 452, 462, 823) on a bottom surface (410*b*, 453*c*, 463*c*, 801*b*, 812*b*, 822*b*) of the glass plate, the opaque material comprising a first opening (e.g., openings 411*d*, 411*e*, 442*a*, 452*a*, 462*a*, 501-508, 601-608, 711, 712, 721, 722, 731, 732, 741, 742) of the pattern, the forming the first mark comprises illuminating a top surface (410*t*, 812*t*) of the glass plate using a light source (402) and an illumination lens (404, 804), wherein light from the light source passes through the glass plate, exits the glass plate at the first opening and illuminates a projection lens (405) before reaching the surface of the wafer, the light exiting the glass plate via the first opening has an asymmetric intensity due to attenuation of the light from the light source at a region of the glass plate on one side (411*d*1, 411*c*1, 506*a*1, 507*a*1, 602*a*2, 606*a*1, 607*a*1, 603*a*2) of the first opening; and based on a position of the first mark on the surface of the wafer, determining whether a focal plane (305*c*, 305*f*, 405*b*) of light reaching the surface of the wafer via the projection lens is above or below the surface of the wafer.

In an example implementation, the method further comprises forming a second mark on the surface of the wafer using the pattern in the reticle, the opaque material comprising a second opening, the forming the second mark comprises illuminating the top surface of the glass plate using the light source and the illumination lens, wherein light from the light source passes through the glass plate, exits the glass plate at the second opening and illuminates the projection lens before reaching the surface of the wafer, wherein: the light existing the glass plate via the second opening has a symmetric intensity; and the determining whether the focal plane is above or below the surface of the wafer is based on a position of the first mark relative to the second mark.

In another embodiment, an apparatus comprises means for performing each of the steps in the above-mentioned method.

In an example implementation, the method further comprises forming a second mark on the surface of the wafer using the pattern in the reticle, the opaque material comprising a second opening, the forming the second mark comprises illuminating the top surface of the glass plate using the light source and the illumination lens, wherein light from the light source passes through the glass plate, exits the glass plate at the second opening and illuminates the projection lens before reaching the surface of the wafer, wherein: the light exiting the glass plate via the second opening has an asymmetric intensity due to attenuation of the light from the light source at a region of the glass plate on one side of the second opening; the asymmetric intensity of the light exiting the glass plate via the first opening is opposite to the asymmetric intensity of the light exiting the glass plate via the second opening; and the determining whether the focal plane is above or below the surface of the wafer is based on a position of the first mark relative to the second mark.

In another embodiment, an apparatus comprises means for performing each of the steps in the above-mentioned method.

The foregoing detailed description of the invention has been presented for purposes of illustration and description. It is not intended to be exhaustive or to limit the invention to the precise form disclosed. Many modifications and variations are possible in light of the above teachings. The described embodiments were chosen in order to best explain the principles of the invention and its practical application, to thereby enable others skilled in the art to best utilize the invention in various embodiments and with various modifications as are suited to the particular use contemplated. It is intended that the scope of the invention be defined by the claims appended hereto.

What is claimed is:

1. A method for patterning, comprising:
forming a first mark on a surface of a wafer using a pattern in a reticle, the reticle comprising a glass plate and an opaque material on a bottom surface of the glass plate, the opaque material comprising a first opening of the pattern, the forming the first mark comprises illuminating a top surface of the glass plate using a light source and an illumination lens, wherein light from the light source passes through the glass plate, exits the glass plate at the first opening and illuminates a projection lens before reaching the surface of the wafer, the light exiting the glass plate via the first opening has an asymmetric intensity due to attenuation of the light from the light source at a region of the glass plate on one side of the first opening; and
based on a position of the first mark on the surface of the wafer, determining whether a focal plane of light reaching the surface of the wafer via the projection lens is above or below the surface of the wafer.

2. The method of claim 1, wherein:
the attenuation of the light is caused by the region of the glass plate having a reduced transmission factor relative to a surrounding region of the glass plate.

3. The method of claim 2, wherein:
the reduced transmission factor is along a first optical path in the glass plate, the first optical path extends between the top surface and the first opening, at a non-perpendicular angle relative to the bottom surface of the glass plate.

4. The method of claim 2, wherein:
the region of the glass plate having the reduced transmission factor extends upwardly in the glass plate from the bottom surface of the glass plate at the one side of the first opening.

5. The method of claim 2, wherein:
the region of the glass plate having the reduced transmission factor comprises a plurality of elements having a refractive index different than a refractive index of a surrounding region of the glass plate; and
the plurality of elements are arranged in a plurality of arrays.

6. The method of claim 5, wherein:
each array is at a different height in the glass plate and comprises rows of the elements, the rows extending laterally in the glass plate.

7. The method of claim 5, wherein:
each element is elongated along a height of the glass plate.

8. The method of claim 1, further comprising:
forming a second mark on the surface of the wafer using the pattern in the reticle, the opaque material comprising a second opening, the forming the second mark comprises illuminating the top surface of the glass plate using the light source and the illumination lens, wherein light from the light source passes through the glass plate, exits the glass plate at the second opening and illuminates the projection lens before reaching the surface of the wafer, wherein:
the light existing the glass plate via the second opening has a symmetric intensity; and
the determining whether the focal plane is above or below the surface of the wafer is based on a position of the first mark relative to the second mark.

9. The method of claim 1, further comprising:
forming a second mark on the surface of the wafer using the pattern in the reticle, the opaque material comprising a second opening, the forming the second mark comprises illuminating the top surface of the glass plate using the light source and the illumination lens, wherein light from the light source passes through the glass plate, exits the glass plate at the second opening and illuminates the projection lens before reaching the surface of the wafer, wherein:
the light exiting the glass plate via the second opening has an asymmetric intensity due to attenuation of the light from the light source at a region of the glass plate on one side of the second opening;
the asymmetric intensity of the light exiting the glass plate via the first opening is opposite to the asymmetric intensity of the light exiting the glass plate via the second opening; and
the determining whether the focal plane is above or below the surface of the wafer is based on a position of the first mark relative to the second mark.

* * * * *